US010359310B2

(12) United States Patent
Inoue et al.

(10) Patent No.: US 10,359,310 B2
(45) Date of Patent: Jul. 23, 2019

(54) SENSOR CIRCUIT

(71) Applicant: SHARP KABUSHIKI KAISHA, Sakai, Osaka (JP)

(72) Inventors: Takahiro Inoue, Sakai (JP); Toshiyuki Takada, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 122 days.

(21) Appl. No.: 15/560,137

(22) PCT Filed: Apr. 12, 2016

(86) PCT No.: PCT/JP2016/061839
§ 371 (c)(1),
(2) Date: Sep. 20, 2017

(87) PCT Pub. No.: WO2016/167259
PCT Pub. Date: Oct. 20, 2016

(65) Prior Publication Data
US 2018/0073920 A1 Mar. 15, 2018

(30) Foreign Application Priority Data
Apr. 15, 2015 (JP) ................................ 2015-083754

(51) Int. Cl.
*G01J 1/42* (2006.01)
*G01J 1/44* (2006.01)
*H01L 31/10* (2006.01)
*H01L 31/12* (2006.01)
*G01J 1/04* (2006.01)
(Continued)

(52) U.S. Cl.
CPC ............... *G01J 1/42* (2013.01); *G01J 1/0411* (2013.01); *G01J 1/0488* (2013.01); *G01J 1/32* (2013.01); *G01J 1/4204* (2013.01); *G01J 1/44* (2013.01); *G01S 7/4816* (2013.01);
(Continued)

(58) Field of Classification Search
CPC .... G01J 1/42; G01J 1/4204; G01J 1/32; G01J 1/0488; G01J 1/0411; G01J 1/44; G01J 3/513; G01S 7/4816; G01S 17/026; H01L 31/10; H01L 31/12
See application file for complete search history.

(56) References Cited

U.S. PATENT DOCUMENTS

| 2015/0207014 A1 | 7/2015 | Inoue et al. |
| 2016/0124221 A1 | 5/2016 | Huang et al. |
| 2016/0210923 A1* | 7/2016 | Yoshida ............... G09G 3/3677 |

FOREIGN PATENT DOCUMENTS

| JP | 2000-131136 A | 5/2000 |
| JP | 2014-236795 A | 12/2014 |

(Continued)

Primary Examiner — Tony Ko
(74) Attorney, Agent, or Firm — ScienBiziP, P.C.

(57) ABSTRACT

A directional characteristic of light that is incident on a light-receiving unit is adjusted in accordance with whether a proximity-illumination sensor is caused to act as a proximity sensor or to act as an illumination sensor. The proximity-illumination sensor (50) includes a light-receiving area selection unit (101) that selects light-receiving sensitivity of which of a first light-receiving area and a second light-receiving area is made higher in accordance with whether the proximity-illumination sensor (50) is caused to act as the proximity sensor or to act as the illumination sensor.

13 Claims, 14 Drawing Sheets

(51) Int. Cl.
  *G01J 1/32*  (2006.01)
  *G01S 17/02*  (2006.01)
  *G01S 7/481*  (2006.01)
  *G01J 3/51*  (2006.01)
(52) U.S. Cl.
  CPC ............ *G01S 17/026* (2013.01); *H01L 31/10* (2013.01); *H01L 31/12* (2013.01); *G01J 3/513* (2013.01)

(56) References Cited

FOREIGN PATENT DOCUMENTS

| | | |
|---|---|---|
| JP | 2015-64909 A | 4/2015 |
| WO | 2014/041884 A1 | 3/2014 |
| WO | 2014/188756 A1 | 11/2014 |

\* cited by examiner

SENSOR CIRCUIT

TECHNICAL FIELD

The present invention relates to a sensor circuit that includes a light-receiving unit for receiving light.

BACKGROUND ART

Recently, an illumination sensor that detects ambient brightness is mounted on a liquid crystal panel of an electronic apparatus such as a cellular phone or a digital camera in order to control ht emission amount of a backlight of the liquid crystal panel in accordance with the illumination of disturbance (light such as sunlight or a fluorescent lamp). Further, demands that proximity sensor is mounted have been increasing in order to reduce power consumption, for example, in order to turn off display in a case where a face approaches the liquid crystal panel in the liquid crystal panel of the electronic apparatus such as a cellular phone or a digital camera. In addition, in recent years, an integrated proximity-illumination sensor in which a proximity sensor and an illumination sensor are integrated has been suggested for a demand for size reduction of the electronic apparatuses.

Analog types of the illumination sensors and the proximity sensors have been the mainstream in related art. However, digital types are common because high resolution is requested recently. Further, a spectral characteristic close to visual sensitivity is requested for the illumination sensor. Consequently, the illumination sensor is requested to be an analog-digital conversion circuit that performs analog-digital conversion for an input current and performs an output and to realize the spectral characteristic close to the visual sensitivity in a simple configuration.

In the integrated proximity-illumination sensor, in order to improve a proximity characteristic, a resin in an upper portion of a light-receiving element is formed into a lens shape, and a directional characteristic is thereby improved. Further, because a reflected light amount from a housing panel of a cellular phone becomes noise, reduction in the noise light amount from housing reflection has to be devised. In this case, there is a problem in that the directional characteristic becomes narrow because the lens is present in the upper portion of the light-receiving element in the integrated proximity-illumination sensor in an illumination sensor action. Further, in a case where the integrated proximity-illumination sensor is mounted on the electronic device such as a cellular phone and where the incident angle of light fluctuates due to hand movement or the like, a problem occurs in that the illumination value fluctuates. Thus, a sensor has to be suggested in which the directional characteristic is wide and the illumination value does not fluctuate even in a case where the lens is present in the upper portion of the light-receiving element.

Here, a description will be made about a scheme for satisfying the above requests. As an illumination sensor in which sensitivity does not depends on the angle of irradiation light, a scheme disclosed in PTL 1 has been suggested. In this scheme, a light shielding unit is provided in which the light transmittance in a central portion is lowest and the light transmittance concentrically and gradually becomes higher toward the outside.

Meanwhile, as an illumination sensor in which the sensitivity does not depends on the angle of irradiation light, a scheme disclosed in PTL 2 has been suggested. In this scheme, light-receiving sensitivity adjustment means is provided in which lowering in the light-receiving sensitivity around a peak is made large compared to lowering in the other light-receiving sensitivities.

Next, FIG. 15 illustrates a configuration in which a sensor output is converted to a digital value by using an analog-digital conversion circuit and the digital value is thereafter subtracted, as an example of an illumination sensor in related art. A current input to a photodiode (PD) 1 with a spectral characteristic of an infrared region is set as an input current Iin1, and a current input to a PD 2 with a spectral characteristic of a visible region to the infrared region is set as an input current Iin2.

The result of analog-digital conversion of the input current Iin2 by ADC2 is set as ADCOUT2, and the result of analog-digital conversion of the input current Iin1 by ADC1 is set as ADCOUT1. ADCOUT1 is multiplied by a by a multiplier and is subtracted from ADCOUT2 by a subtractor, and the same result as a scheme disclosed in PTL 3 may thereby be obtained.

$$ADCOUT2 - ADCOUT1 * \alpha = Iin2 - Iin1 * \alpha$$

As for the illumination sensor, a scheme has become common in which light such as sunlight or a fluorescent lamp is converted to a current by a PD and a digital output is performed by an integration type analog-digital conversion circuit. As for the proximity sensor, a scheme that includes the integration type analog-digital conversion circuit and a driving circuit of a light-emitting diode has been employed in recent years.

FIG. 13 illustrates a configuration of a common proximity sensor. This proximity sensor includes a PD, a light-emitting diode (LED), and a control circuit. The LED is driven from the control circuit, conversion to a current is performed by the PD for light reception, and detection is performed by the control circuit. The difference between the data in the period in which the LED is driven (Data1) and the data in the period in which the LED is not driven (Data2) is set as proximity data (Data1−Data2). In a case where a detection object is present, reflected light from the detection object is intense. Thus, as illustrated in FIG. 14(a), the current of the PD becomes high and exceeds a threshold value Data_th of the control circuit, and a determination is made as proximity. In a case where no detection object is present, reflected light from the detection object is weak. Thus, as illustrated in FIG. 14(b), the current of the PD is low and does not exceed the threshold value Data_th of the control circuit, and a determination is thus made as non-proximity. In this case, the reflected light amount from the housing panel of the cellular phone, which is indicated by the broken line arrows in FIG. 13, becomes noise. Thus, the reduction in the noise light amount from the housing reflection has to be devised.

CITATION LIST

Patent Literature

PTL 1: Japanese Unexamined Patent Application Publication No. 7-270235 (laid open on Oct. 20, 1995)
PTL 2: Japanese Unexamined Patent Application Publication No. 9-15044 (laid open on Jan. 17, 1997)
PTL 3: Japanese Unexamined Patent Application Publication No. 2007-73591 (laid open on Mar. 22, 2007)

SUMMARY OF INVENTION

Technical Problem

However, the above-described techniques in related art have the following problems. For example, as in related art, in a case where the light transmittance in a central portion is lowest and the light transmittance concentrically and gradually becomes higher toward the outside, it is possible to obtain a wide directional characteristic as an illumination sensor. Because the wide directional characteristic is obtained, in a case where the illumination sensor is mounted on a cellular phone or the like, a stable illumination result may be obtained even in a case where the incident angle of light fluctuates due to hand movement or the like.

In a case where the directional characteristic is wide in a proximity sensor, a reflected light amount from a cellular phone panel housing of a cellular phone illustrated in FIG. 13 becomes noise. This leads to a problem in that a determination may not be made whether the reflected light is the reflected light from a proximity detection object or the reflected light from the cellular phone panel housing. In order to reduce a noise light amount due to the reflected light from the cellular phone panel housing housing, it is desirable that the directional characteristic is set narrow, the sensitivity for the direct front is high, and the sensitivity for the periphery is low. On the other hand, in a case where the illumination sensor that has the narrow directional characteristic is mounted on a cellular phone or the like, a problem occurs in that a stable illumination result may not be obtained in a case where the incident angle of light fluctuates due to hand movement or the like.

As described above, as for the directional characteristics that are respectively requested in an illumination sensor action and a proximity sensor action, conflicting directional characteristics that are wide directional characteristic and narrow directional characteristic are requested. Thus, in related art, a configuration has not been present which adjusts the directional characteristic such that performance is sufficient for both of those.

The present invention has been made in consideration of the above problems, and an object thereof is to provide a sensor circuit that may adjust a directional characteristic of light which is incident on a light-receiving unit in accordance with whether the sensor circuit is caused to act as a proximity sensor or to act as an illumination sensor.

Solution to Problem

To solve the above problems, a sensor circuit according to one aspect of the present invention is a sensor circuit including a light-receiving unit, in which light-receiving areas of the light-receiving unit are categorized into a first light-receiving area that includes plural light-receiving elements arranged in a vicinity of a center of the light-receiving unit and a second light-receiving area that includes plural light-receiving elements arranged in distant positions from the center of the light-receiving unit, the first light-receiving area and the second light-receiving area being individually set in cases where the sensor circuit acts as a proximity sensor and acts as an illumination sensor, and the sensor circuit includes a light-receiving area selection unit that selects light-receiving sensitivity of which of the first light-receiving area and the second light-receiving area is made higher in accordance with whether the sensor circuit acts as the proximity sensor or acts as the illumination sensor.

Advantageous Effects of Invention

One aspect of the present invention provides an effect of enabling a directional characteristic of light that is incident on a light-receiving unit to be adjusted in accordance with whether a sensor circuit is caused to act as a proximity sensor or to act as an illumination sensor.

BRIEF DESCRIPTION OF DRAWINGS

FIG. 1(a) illustrates the configuration of the sensor circuit in an illumination sensor action, and FIG. 1(b) illustrates the configuration of the sensor circuit in a proximity sensor action.

FIG. 2(a) is a cross-sectional diagram that illustrates the outline configuration of the sensor circuit, and FIG. 2(b) is a top diagram that illustrates the configuration of the light-receiving unit.

FIG. 3(a) illustrates the state of the light-receiving unit in the illumination sensor action, and FIG. 3(b) illustrates the directional characteristics of the light-receiving unit in the illumination sensor action.

FIG. 4(a) illustrates the state of the light-receiving unit in the proximity sensor action, and FIG. 4(b) illustrates the directional characteristics of the light-receiving unit in the proximity sensor action.

FIG. 5(a) is a circuit diagram that illustrates one example of the structure of the light-receiving element, FIG. 5(b) is a graph that represents the spectral characteristics of the light-receiving element, and FIG. 5(c) is a diagram that illustrates one example of the light-receiving element and a switch structure.

FIG. 8(a) illustrates one example of the configuration of the light-receiving unit according the second embodiment, FIG. 8(b) is a diagram that illustrates one example of the configuration of the light-receiving unit according to the third embodiment, FIG. 8(c) is a diagram that illustrates a modification example of the configuration of the light-receiving unit (light-receiving element), and FIG. 8(d) is a diagram that illustrates another modification example of the configuration of the light-receiving unit (light-receiving element).

FIG. 9(a) is a circuit diagram that illustrates one example of the structure of the light-receiving element according to the fourth embodiment, and FIG. 9(b) is a graph that represents the spectral characteristics of the light-receiving element.

FIG. 12(a) illustrates the external appearance of the cellular phone according to the sixth embodiment, and FIG. 12(b) illustrates the external appearance of the digital camera according to the seventh embodiment.

FIG. 14(a) illustrates the action waveforms of the proximity sensor in a case where a proximity object is present, and FIG. 14(b) illustrates the action waveforms of the proximity sensor in a case where a proximity object is not present.

DESCRIPTION OF EMBODIMENTS

Figure 1:
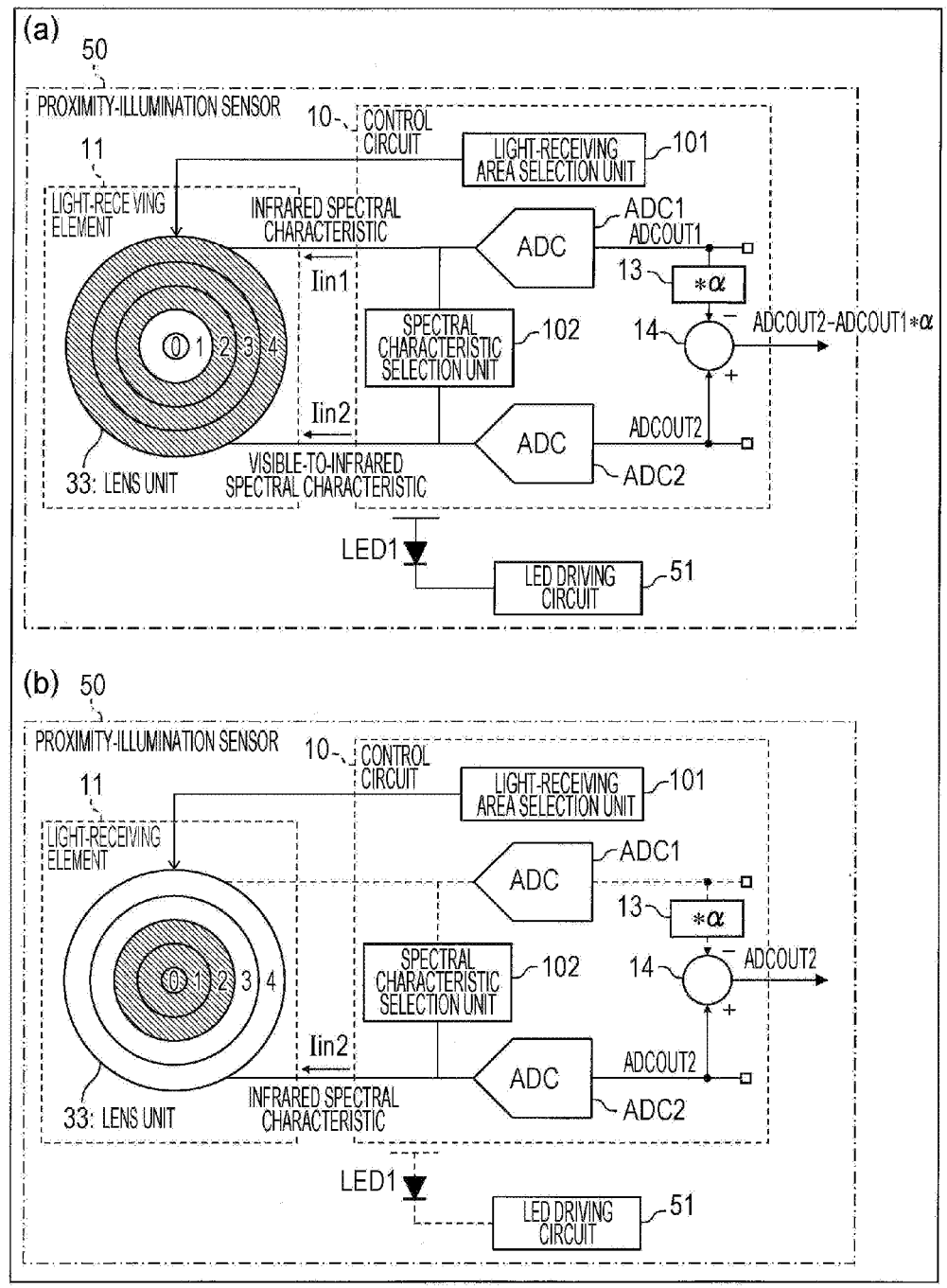
FIG. 1 is a circuit diagram that illustrates a configuration of a sensor circuit according to a first embodiment of the present invention.

Embodiments of the present invention will be described in the following with reference to FIGS. 1 to 12. In the following, for convenience of description, the same reference characters will be given to configurations that have the same functions as the configurations described in particular embodiments, and a description thereof may not be made.

First Embodiment

First, a configuration and an action of a proximity-illumination sensor (sensor circuit) 50 according to a first embodiment of the present invention will be described with reference to FIG. 1 to FIG. 7.

FIG. 1 is a circuit diagram that illustrates a configuration of the proximity-illumination sensor 50. As illustrated in FIG. 1, the proximity-illumination sensor 50 includes a control circuit 10, a light-receiving element (light-receiving unit) 11, an LED 1, and an LED driving circuit 51.

Figure 2:
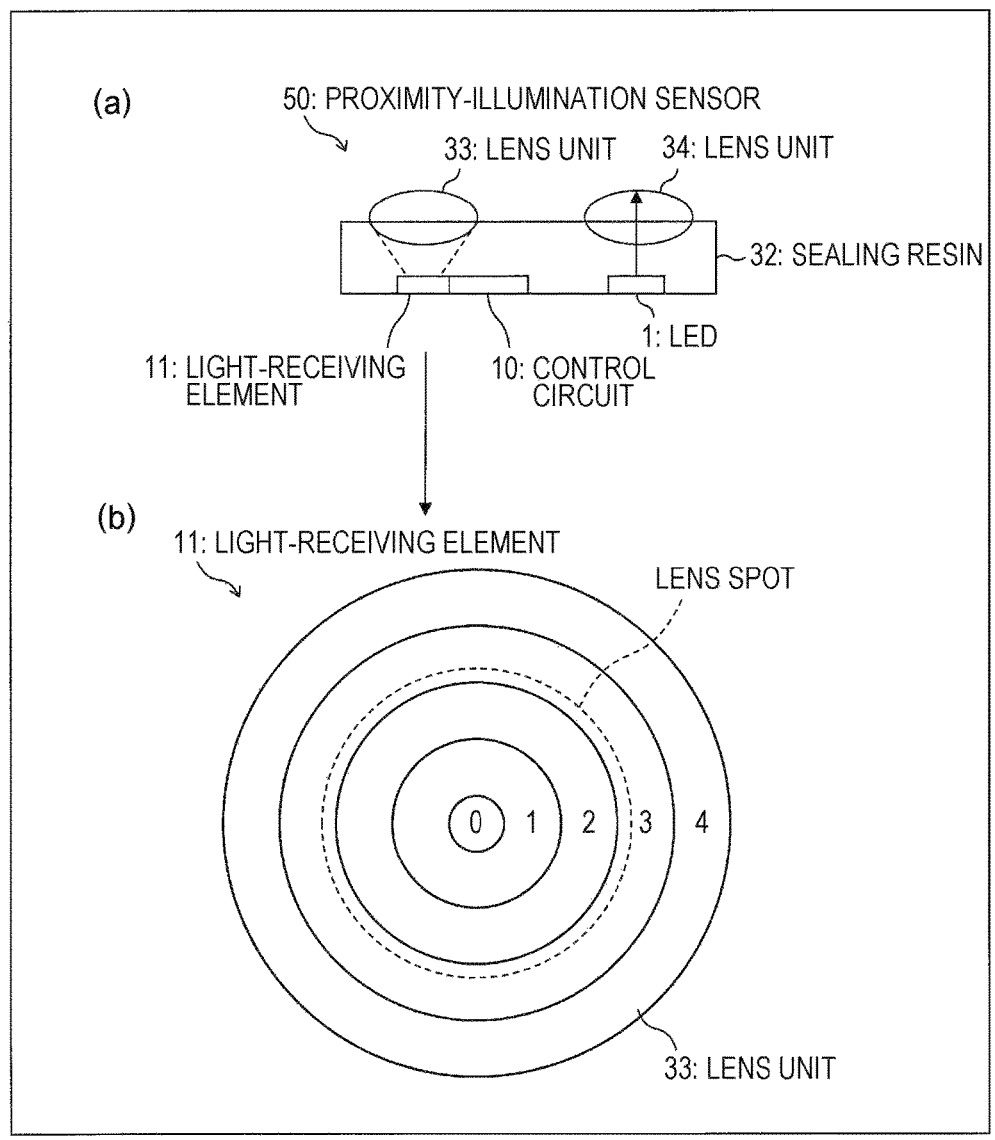
FIG. 2 is a diagram that illustrates an outline configuration of the sensor circuit according to the first embodiment and a configuration of a light-receiving unit that is included in the sensor circuit.

FIG. 2 is a diagram that illustrates an outline configuration of the proximity-illumination sensor 50 and the light-receiving element 11 that is included in the proximity-illumination sensor 50. FIG. 2(a) is a cross-sectional diagram that illustrates the outline configuration of the proximity-illumination sensor 50. As illustrated in FIG. 2(a), the LED 1, the control circuit 10, and the light-receiving element 11 are sealed by a sealing resin 32. Further, a lens unit 33 (lens structure) is arranged in an upper portion (on a side of a light-receiving surface) of the light-receiving element 11, and a lens unit 34 is arranged in an upper portion (on a light outgoing side) of the LED 1.

The above lens structure enables signal light from the direct front to be concentrated and enables a spot of housing reflection to be displaced to the outside where sensitivity is not present in a case where the proximity-illumination sensor 50 acts as a proximity sensor. In a case where the proximity-illumination sensor 50 acts as an illumination sensor, a directional characteristic may be flattened.

Meanwhile, FIG. 2(b) is a top diagram that illustrates the configuration of the light-receiving element 11. In FIG. 2(b), the region that is surrounded by the broken line circle indicates a lens spot of the lens unit 33.

(Light-Receiving Element 11)

The lens unit 33 is provided on the side of the light-receiving surface of the light-receiving element 11 that receives light. In this embodiment, the light-receiving element 11 includes concentric circular light-receiving elements PD0 to PD4, as one example. Further, in this embodiment, from the vicinity of the center of the light-receiving element 11 to a distant position from the center, the light-receiving elements PD0 (inside) to PD4 (outside) are arranged in this order. Further, each of the light-receiving elements PD0 to PD4 denotes an aggregation of plural light-receiving elements PD that are arranged to be lined up along a prescribed concentric circle.

Light-receiving areas on the side of the light-receiving surface of the light-receiving element 11 are categorized into a first light-receiving area that includes plural light-receiving elements PD arranged in the vicinity of the center (inside) of the light-receiving element 11 and a second light-receiving area that includes plural light-receiving elements PD arranged in distant positions from the center (outside) of the light-receiving element 11, which are individually set in cases where the proximity-illumination sensor 50 acts as the proximity sensor and acts as the illumination sensor. That is, the first light-receiving area is the light-receiving area that is individually set in the cases where the proximity-illumination sensor 50 acts as the proximity sensor and acts as the illumination sensor and is the light-receiving area that includes the plural light-receiving elements PD arranged in the vicinity of the center of the light-receiving element 11. Meanwhile, the second light-receiving area is the light-receiving area that is individually set in the cases where the proximity-illumination sensor 50 acts as the proximity sensor and acts as the illumination sensor and is the light-receiving area that includes the plural light-receiving elements PD arranged in the distant positions from the center of the light-receiving element 11.

FIG. 1(a) illustrates the configuration of the proximity-illumination sensor 50 in an illumination sensor action. In the illumination sensor action, the hatched portion of the outside concentric circles illustrated in FIG. 1(a) is set as the second light-receiving area and includes the light-receiving elements PD2 to PD4. On the other hand, the other portion of the inside concentric circles than the hatched portion is set as the first light-receiving area and includes the light-receiving elements PD0 and PD1.

Meanwhile, FIG. 1(b) illustrates the configuration of the proximity-illumination sensor 50 in a proximity sensor action. In the proximity sensor action, the hatched portion of the inside concentric circles illustrated in FIG. 1(b) is set as the first light-receiving area and includes the light-receiving elements PD0 to PD2. On the other hand, the other portion of the outside concentric circles than the hatched portion is set as the second light-receiving area and includes the light-receiving elements PD3 and PD4.

(Control Circuit 10)

As illustrated in FIG. 1, the control circuit 10 includes an analog-digital conversion circuit ADC1 (hereinafter referred to as AD conversion circuit ADC1), an analog-digital conversion circuit ADC2 (hereinafter referred to as AD conversion circuit ADC2), a multiplication unit 13, a subtraction unit 14, a light-receiving area selection unit 101, and a spectral characteristic selection unit 102.

(AD Conversion Circuit ADC1 and AD Conversion Circuit ADC2)

As for the AD conversion circuit ADC1, an input unit is electrically connected with the plural light-receiving elements PD included in the light-receiving element 11, and an output unit is connected with the multiplication unit 13. As for the AD conversion circuit ADC2, an input unit is electrically connected with the plural light-receiving elements PD included in the light-receiving element 11, and an output unit is connected with the subtraction unit 14. More specifically, for example, about half the light-receiving elements PD of the plural light-receiving elements PD included in the light-receiving element PD2 are electrically connected with the AD conversion circuit ADC1, and the remaining light-receiving elements PD are electrically connected with the AD conversion circuit ADC2. Further, the plural light-receiving elements PD that are electrically connected with the AD conversion circuit ADC1 and the plural light-receiving elements PD that are electrically connected with the AD conversion circuit ADC2 among the plural light-receiving elements PD included in the light-receiving element PD2 are respectively arranged in the light-receiving element PD2 while being dispersed equivalently.

(Multiplication Unit 13 and Subtraction Unit 14)

In a case where the proximity-illumination sensor 50 acts as the illumination sensor, the multiplication unit 13 outputs a signal (ADCOUT1×α) that results from the multiplication of an output signal (ADCOUT1) from the AD conversion circuit ADC1 by α to the subtraction unit 14. The subtraction unit 14 outputs a signal (ADCOUT2−ADCOUT1×α) that results from the subtraction of the output signal (AD-COUT1×α) from the multiplication unit 13 from an output signal (ADCOUT2) from the AD conversion circuit ADC 2. In the state illustrated in FIG. 1(a), this output signal (ADCOUT2−ADCOUT1×α) becomes a signal that indicates the illumination of visible light detected by the control circuit 10.

Meanwhile, in a case where the proximity-illumination sensor 50 acts as the proximity sensor, the AD conversion circuit ADC1 and the multiplication unit 13 do not function, and the output signal of the multiplication unit 13 is not output to the subtraction unit 14. Thus, in the state illustrated in FIG. 1(b), the output (ADCOUT2) itself of the AD conversion circuit ADC2 becomes a signal that indicates the received light amount of infrared light detected by the control circuit 10.

(Light-Receiving Area Selection Unit 101)

The light-receiving area selection unit 101 is set to select the light-receiving sensitivity of which of the first light-receiving area and the second light-receiving area is made higher (whether the light-receiving elements PD included in the first light-receiving area are short-circuited or the light-receiving elements PD included in the second light-receiving area are short-circuited) in accordance with whether the proximity-illumination sensor 50 acts as the proximity sensor or acts as the illumination sensor. Here, in a case where the light-receiving elements PD included in the first light-receiving area are short-circuited, the light-receiving sensitivity of the second light-receiving area becomes higher than the light-receiving sensitivity of the first light-receiving area. Accordingly, the directional characteristic of the light that is incident on the light-receiving element 11 may be made wide. Meanwhile, in a case where the light-receiving elements PD included in the second light-receiving area are short-circuited, the light-receiving sensitivity of the first light-receiving area becomes higher than the light-receiving sensitivity of the second light-receiving area. Accordingly, the directional characteristic of the light that is incident on the light-receiving element 11 may be made narrow. As a result, the light-receiving area selection unit 101 may adjust the directional characteristic of the light that is incident on the light-receiving element 11 in accordance with whether the proximity-illumination sensor 50 is caused to act as the proximity sensor or to act as the illumination sensor.

Further, in a case where the proximity-illumination sensor 50 acts as the illumination sensor, as illustrated in FIG. 1(a), the light-receiving area selection unit 101 short-circuits the light-receiving elements PD (light-receiving elements PD0 and PD1) included in the first light-receiving area and thereby makes the light-receiving sensitivity of the second light-receiving area higher than the light-receiving sensitivity of the first light-receiving area. That is, in the illumination sensor action, the outside light-receiving elements PD2 to PD4 are used. In such a manner, the inside light-receiving elements PD0 and PD1 are not used, the sensitivity for the direct front is thereby lowered, and a wide directional characteristic may be obtained.

Figure 3:
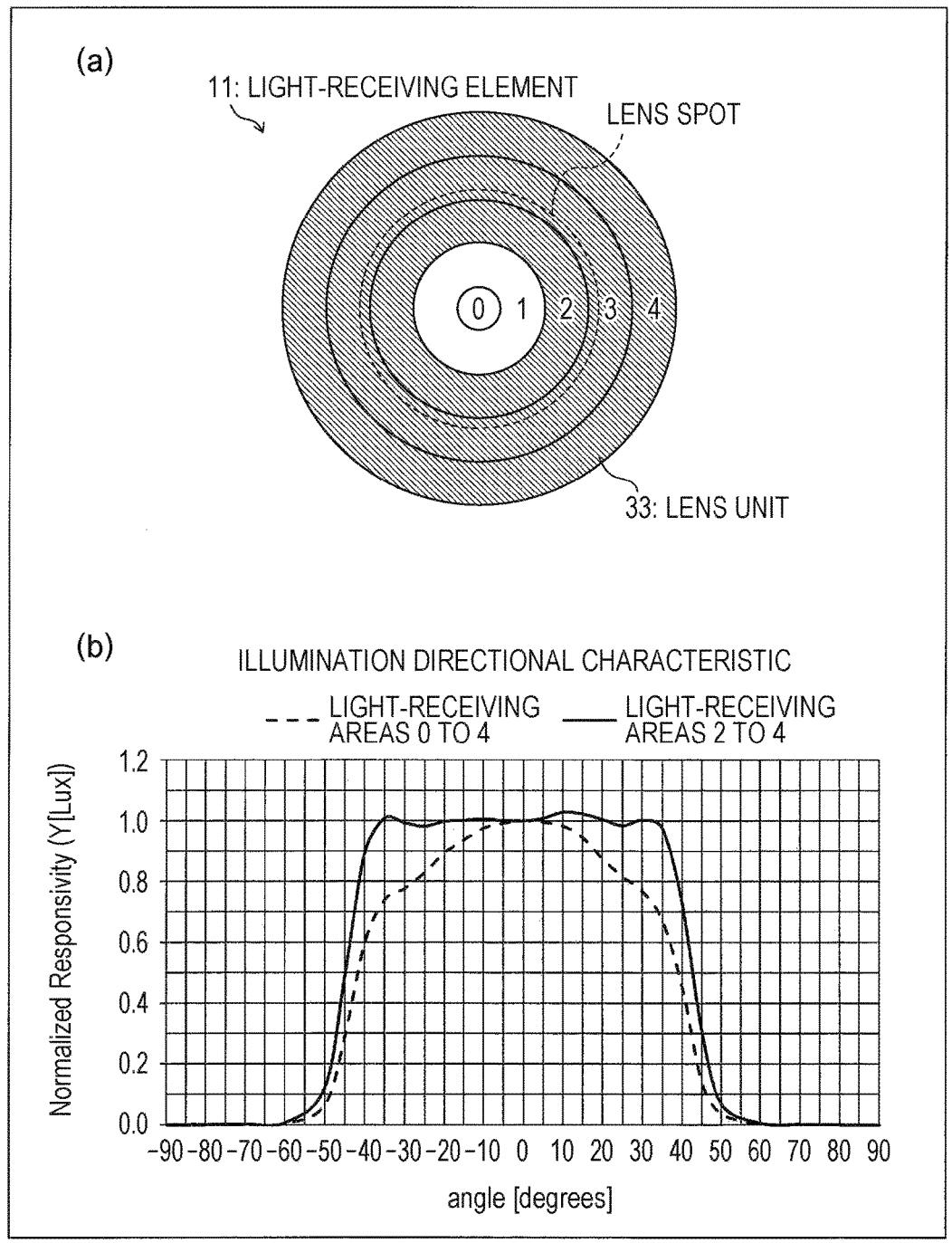
FIG. 3 is related to the sensor circuit and is a diagram that illustrates a state of the light-receiving unit in the illumination sensor action and directional characteristics.

FIG. 3 is related to the proximity-illumination sensor 50 and is a diagram that illustrates the state and the directional characteristics of the light-receiving element 11 in the illumination sensor action. FIG. 3(a) illustrates the state of the light-receiving element 11 in the illumination sensor action. The hatched portion illustrated in FIG. 3(a) is the second light-receiving area. Meanwhile, FIG. 3(b) illustrates the directional characteristics of the light-receiving element 11 in the illumination sensor action.

As aforementioned, the light-receiving sensitivity of the second light-receiving area is made higher than the light-receiving sensitivity of the first light-receiving area, and it thereby becomes possible to obtain the wide directional characteristic. In a case where the proximity-illumination sensor 50 is mounted on an electronic apparatus such as a cellular phone, a stable illumination result may be obtained even in a case where the incident angle of light fluctuates due to hand movement or the like.

Further, in a case where the proximity-illumination sensor 50 acts as the proximity sensor, the light-receiving area selection unit 101 short-circuits the light-receiving elements PD (light-receiving elements PD3 and PD4) included in the second light-receiving area and thereby makes the light-receiving sensitivity of the first light-receiving area higher than the light-receiving sensitivity of the second light-receiving area. That is, in the proximity sensor action, the inside light-receiving elements PD0 to PD2 are used. In such a manner, the outside light-receiving elements PD3 and PD4 are not used, the sensitivity for the periphery is thereby lowered, and the directional characteristic may be narrowed.

Figure 4:
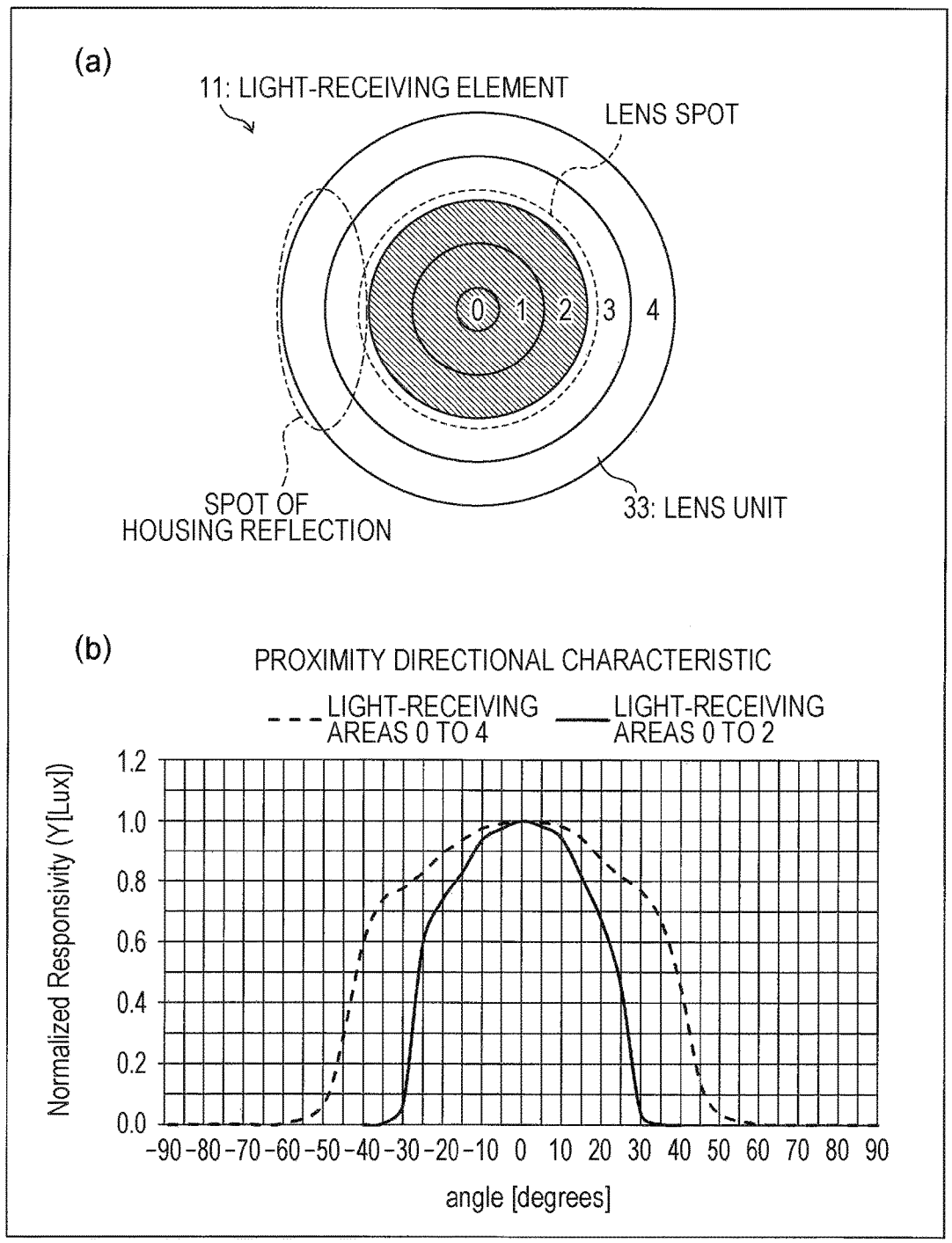
FIG. 4 is related to the sensor circuit and is a diagram that illustrates a state of the light-receiving unit in the proximity sensor action and the directional characteristics.

FIG. 4 is related to the proximity-illumination sensor 50 and is a diagram that illustrates the state and the directional characteristics of the light-receiving element 11 in the proximity sensor action. FIG. 4(a) illustrates the state of the light-receiving unit in the proximity sensor action. The hatched portion illustrated in FIG. 4(a) is the first light-receiving area. Meanwhile, FIG. 4(b) illustrates the directional characteristics of the light-receiving unit in the proximity sensor action.

As a result, the light-receiving sensitivity of the first light-receiving area is made higher than the light-receiving sensitivity of the second light-receiving area, and it thereby becomes possible to obtain the narrow directional characteristic. In a case where the proximity-illumination sensor 50 is mounted on an electronic apparatus such as a cellular phone, the noise light amount due to the housing panel reflection of the electronic apparatus may be reduced. Accordingly, the sensitivity to the reflected light from the cellular phone panel housing may be reduced, the sensitivity to the reflected light from the proximity detection object from the direct front may thereby be made higher, and a proximity characteristic may be improved. As indicated by the portion surrounded by the one-dot chain line in FIG. 4(a), the spot of the reflected light from the cellular phone panel housing usually tends to be offset from a close position to the LED 1 to the opposite side. Note that a short-circuiting method of each of the light-receiving elements PD will be described later.

In the regions of a light-receiving area 2 that are respectively illustrated FIGS. 3(a) and 3(b), an area that acts as the illumination sensor and an area that acts as the proximity sensor partially overlap with each other. The proximity-illumination sensor 50 is used by switching the spectral characteristics by operations of switches SW41 and SW42 illustrated in FIG. 5(c). In a light-receiving area, the area that acts as the illumination sensor and the area that acts as the proximity sensor are caused to partially overlap with each other and are switched in accordance with use. Accordingly, the wider directional characteristic may be obtained in a case of the illumination sensor, and the optimal light-receiving area that matches the spot may be selected in a case of the proximity sensor.

(Spectral Characteristic Selection Unit 102)

The spectral characteristic selection unit 102 causes a portion of the light-receiving elements PD of the light-receiving elements PD included in the first light-receiving area and the light-receiving elements PD included in the second light-receiving area to have the spectral characteristic for an infrared region and causes the remaining light-receiving elements PD to have the spectral characteristic for the infrared region to a visible light region. Accordingly, in a case where the proximity-illumination sensor 50 acts as the illumination sensor, the output of the spectral characteristic for the infrared region is subtracted from the output of the spectral characteristic for the infrared region to the visible light region, and an illumination characteristic that matches the visual sensitivity may thereby be realized. Meanwhile, in a case where the proximity-illumination sensor 50 acts as the proximity sensor, the output of the spectral characteristic for the infrared region is used, and it thereby becomes possible to reduce visible light and to reduce noise such as a fluorescent lamp.

Note that a selection method of the spectral characteristics of the light-receiving elements PD by the spectral characteristic selection unit 102 will be described later.

(LED 1 and LED Driving Circuit 51)

The LED driving circuit 51 performs control such that the LED 1 does not emit light in a case where the proximity-illumination sensor 50 is caused to act as the illumination sensor. Meanwhile, the LED driving circuit 51 performs control such that the LED 1 emits light and outputs infrared light in a case where the proximity-illumination sensor 50 is caused to act as the proximity sensor.

(Light-Receiving Element PD)

Figure 5:
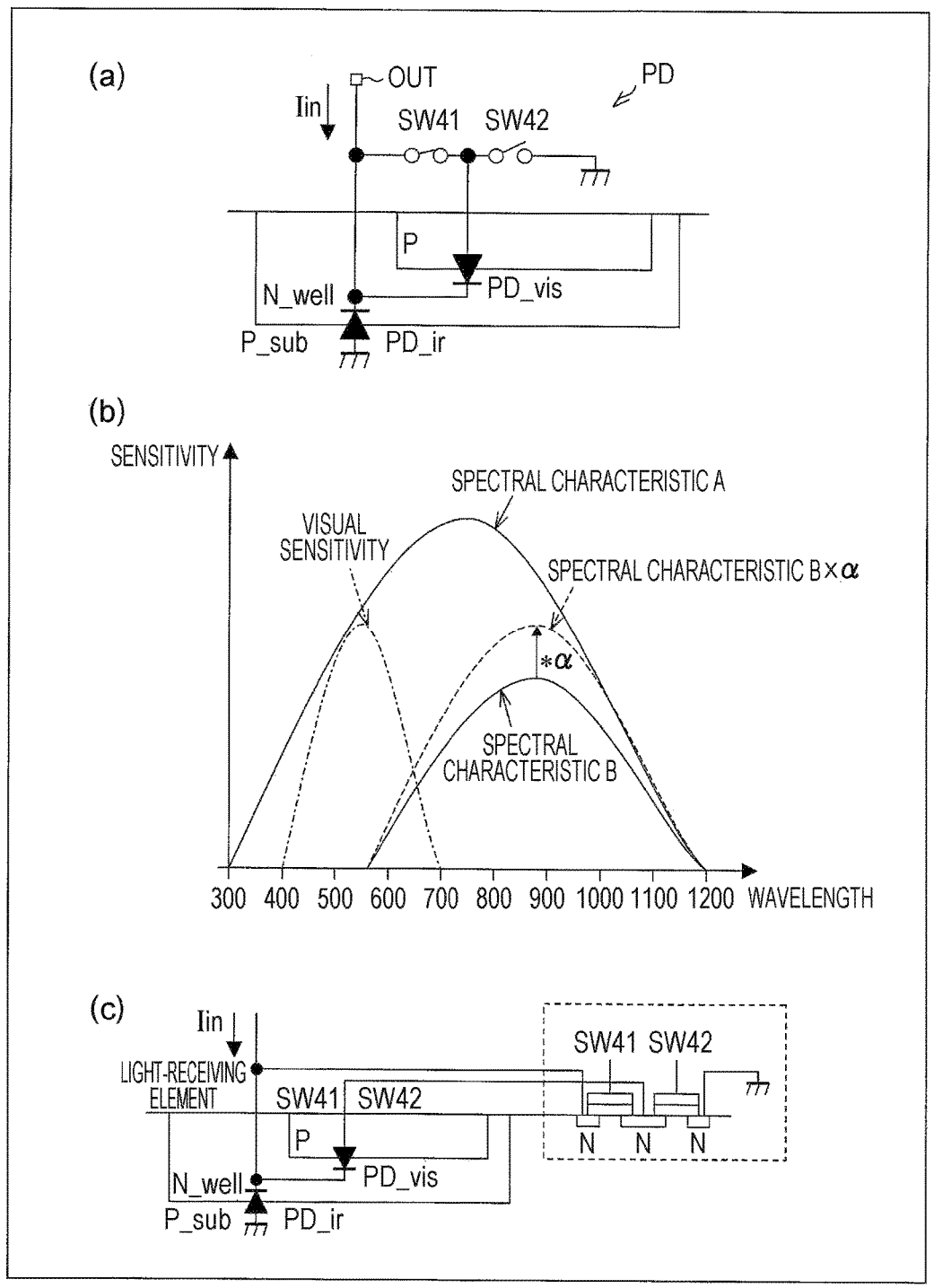
FIG. 5 is related to the sensor circuit and is a diagram that illustrates one example of a structure of a light-receiving element that is included in the light-receiving unit and spectral characteristics of the light-receiving element.

Next, FIG. 5 is a diagram that illustrates one example of a structure of the light-receiving element PD included in the light-receiving element 11 and the spectral characteristics of the light-receiving element PD. FIG. 5(a) is a circuit diagram that illustrates one example of the structure of the light-receiving element PD. Meanwhile, FIG. 5(b) is a graph that represents the spectral characteristics of the light-receiving element PD.

The light-receiving element PD is configured with a semiconductor substrate, the switch SW41, and the switch SW42. The semiconductor substrate has a structure in which an n-type well layer (n-type semiconductor region N_well) is formed on a p-type substrate (p-type semiconductor substrate P_sub) and a p-type diffusion layer (p-type semiconductor region P) is formed on the n-type well layer. The p-type substrate is connected with a ground. The n-type well layer is connected with an output terminal OUT with a higher electric potential than the ground.

In the semiconductor substrate, a photodiode PDir is formed with the p-type substrate and the n-type well layer (p-n junction). Further, a photodiode PDvis is formed with the n-type well layer and the p-type diffusion layer (p-n junction). Although the photodiode PDir and the photodiode PDvis are formed on the same semiconductor substrate, peak sensitivity wavelengths are different due to the difference in depth between connection portions. That is, the photodiode PDir is formed in a deep position, and the peak sensitivity wavelength is positioned in a wavelength range of infrared rays. Meanwhile, the photodiode PDvis is formed in a shallow position, and the peak sensitivity wavelength is positioned in a wavelength range of visible light.

One terminal of the switch SW41 is connected with the output terminal OUT, and the other terminal is connected with the p-type diffusion layer. The switch SW41 opens or closes (on or off) in response to a switch signal and makes electrical connection between both sides continuous or disconnected. One terminal of the switch SW42 is connected with the other terminal of the switch SW41 and the p-type diffusion layer, and the other terminal is connected with the ground. The switch SW42 opens or closes (on or off) in response to a switch signal and makes electrical connection between both sides continuous or disconnected. Each of the above switch signals is supplied from the above-described light-receiving area selection unit 101 or the spectral characteristic selection unit 102.

Thus, in a case where settings are made as "switch SW41=on and switch SW42=off", the photodiode PDir becomes continuous, and the photodiode PDvis is short-circuited. Thus, only the photodiode PDir is used in the light-receiving element PD. Therefore, in a case where the light-receiving element PD receives light in this connection configuration, a photocurrent that flows in the photodiode PDir is output as a current Iin of the light-receiving element PD. Thus, the light-receiving element PD in this connection configuration has the spectral characteristic that has sensitivity to the wavelength range of infrared rays (hereinafter referred to as spectral characteristic B).

Meanwhile, in a case where settings are made as "switch SW41=off and switch SW42=on", the photodiode PDir and the photodiode PDvis become continuous. Thus, the light-receiving element PD uses both of those. Therefore, in a case where the light-receiving element PD receives light in this connection configuration, the current as the sum of the photocurrent that flows in the photodiode PDir and the photocurrent that flows in the photodiode PDvis is output as the current Iin of the light-receiving element PD. Thus, the light-receiving element PD in this connection configuration has the spectral characteristic that has sensitivity to the wavelength range of the visible light region to the infrared region (hereinafter referred to as spectral characteristic A).

The above-described spectral characteristic selection unit 102 switches on and off the above switch SW41 and switch SW42 and thereby selects the spectral characteristic of the light-receiving element PD.

In FIG. 5(b), the horizontal axis represents wavelength (nm), and the vertical axis represents sensitivity. Further, in the graph, the solid lines respectively represents the spectral characteristic A and the spectral characteristic B, the broken line represents the spectral characteristic B multiplied by a, and the one-dot chain line represents the visual sensitivity.

The spectral characteristic A that has sensitivity to the wavelength range of the visible light region to the infrared region has characteristics of having the peak sensitivity wavelength around 750 nm and of being gradually attenuated in a range of about 300 nm to about 1200 nm.

The spectral characteristic B that has sensitivity to the wavelength range of the infrared region has characteristics of having the peak sensitivity wavelength around 900 nm and of being gradually attenuated in a range of about 550 nm to about 1200 nm.

The visual sensitivity has characteristics of having the peak sensitivity wavelength around 550 nm and of being gradually attenuated in a range of about 400 nm to about 700 nm. Note that the sensitivity at the peak sensitivity wavelength of the spectral characteristic B is lower than that at the peak sensitivity wavelength of the visual sensitivity. A constant α is a constant for making the spectral characteristic B close to the visual sensitivity, and a spectral characteristic B×α has the intensity of the spectral characteristic B that is multiplied by α.

In such a manner, the light-receiving element PD includes the two p-n junctions and thereby includes two photodiodes, that is, the photodiode PDir and the photodiode PDvis. Further, the light-receiving element PD is configured such that the connection configurations are switched by the switches SW41 and SW42 and either one of the spectral characteristic A and the spectral characteristic B may thereby be set. As a result, it is possible to select a desired spectral characteristic in accordance with whether the proximity-illumination sensor 50 is caused to act as the proximity sensor or to act as the illumination sensor.

Meanwhile, in a case where settings are made as "switch SW41=on and switch SW42=on", the photodiode PDir and the photodiode PDvis are short-circuited. Thus, both of those are together short-circuited in the light-receiving element PD. That is, the above-described light-receiving area selection unit 101 realizes a state where the light-receiving element PD has no light-receiving sensitivity by making "switch SW41=on and switch SW42=on" (the light-receiving elements PD are caused to become a short-circuit state) in the light-receiving elements PD included in the first light-receiving area.

As illustrated in FIG. 3(a), in a case where the proximity-illumination sensor 50 acts as the illumination sensor, the light-receiving area selection unit 101 makes "switch SW41=on and switch SW42=on" for the light-receiving element PD0 and the light-receiving element PD1 and thereby lowers the sensitivity of a central portion of the light-receiving element 11.

Meanwhile, as illustrated in FIG. 4(a), in a case where the proximity-illumination sensor 50 acts as the proximity sensor, the light-receiving area selection unit 101 makes "switch SW41=on and switch SW42=on" for the light-receiving element PD3 and the light-receiving element PD4 and thereby lowers the sensitivity of a peripheral portion.

(AD Conversion Circuits)

The above-described AD conversion circuits ADC1 and ADC2 illustrated in FIG. 1 have the same configuration. The configuration of the AD conversion circuit ADC1 and ADC2 will be described by using an AD conversion circuit ADC of FIG. 6.

Figure 6:
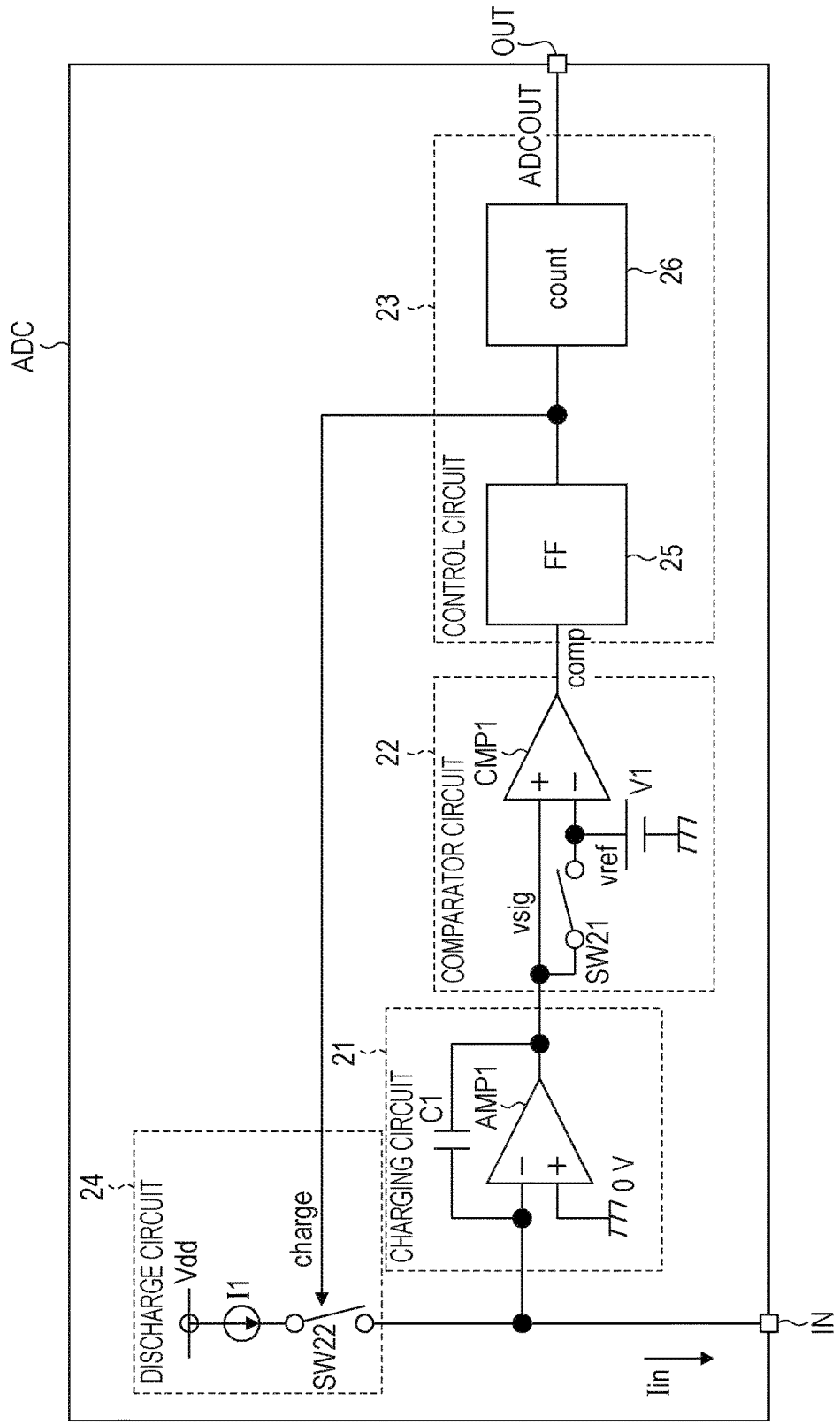
FIG. 6 is related to the sensor circuit and illustrates one configuration example of an AD conversion circuit.

FIG. 6 is a diagram that illustrates a configuration of the AD conversion circuit ADC. The AD conversion circuit ADC is an integration type AD conversion circuit that converts the current amount of the input current Iin to a digital value and outputs that. As illustrated in FIG. 6, the AD conversion circuit ADC includes a charging circuit 21, a comparator circuit 22, a control circuit 23, and a discharge circuit 24. Further, the AD conversion circuit ADC may include an input terminal IN and the output terminal OUT and may be integrated.

The charging circuit 21 is a circuit that is charged by the input current Iin and is configured with an amplifier circuit AMP1 and a capacitor C1 that stores the charge in accordance with the input current Iin. In the amplifier circuit AMP1, an inverting input terminal is connected with the input terminal IN, a non-inverting input terminal is connected with the ground (0 V), and an output terminal is connected with the comparator circuit 22. The capacitor C1 is provided between the inverting input terminal and the output terminal of the amplifier circuit AMP1. Accordingly, the amplifier circuit AMP1 and the capacitor C1 configure an integrating circuit.

The comparator circuit 22 is configured with a comparator CMP1, a switch SW21, and a reference power source V1. In the comparator CMP1, a non-inverting input terminal is connected with the charging circuit 21, an inverting input terminal is connected with the charging circuit 21 via the switch SW21 and is connected with the reference power source V1, and an output terminal is connected with the control circuit 23. The switch SW21 opens or closes (on or off) in response to a switch signal and makes electrical connection between the charging circuit 21 and the inverting input terminal of the comparator CMP1 continuous or disconnected. The reference power source V1 applies a reference voltage Vref to the inverting input terminal of the comparator CMP1.

The control circuit 23 counts the frequency of discharge performed by the discharge circuit 24 in a measurement time based on a comparison result of the comparator circuit 22, outputs the digital value that is correspondent to the frequency, and is configured with a flip-flop (FF) 25 and a counter (count) 26. In the FF 25, an input unit is connected with the comparator circuit 22, and an output unit is connected with the counter 26 and is also connected with the discharge circuit 24. An output unit of the counter 26 is connected with the output terminal OUT.

The discharge circuit 24 causes the charging circuit 21 to perform discharge (to discharge the charge stored in the capacitor C1) in a case where the output voltage of the charging circuit 21 exceeds the reference voltage Vref and is configured with a current source I1 and a switch SW22. One terminal of the switch SW22 is connected with the current source I1, and the other terminal is connected with the charging circuit 21 and the input terminal IN. The switch SW22 opens or closes (on or off) in response to a switch signal (an output signal charge of the FF 25) and makes electrical connection between both sides continuous or disconnected.

Figure 7:
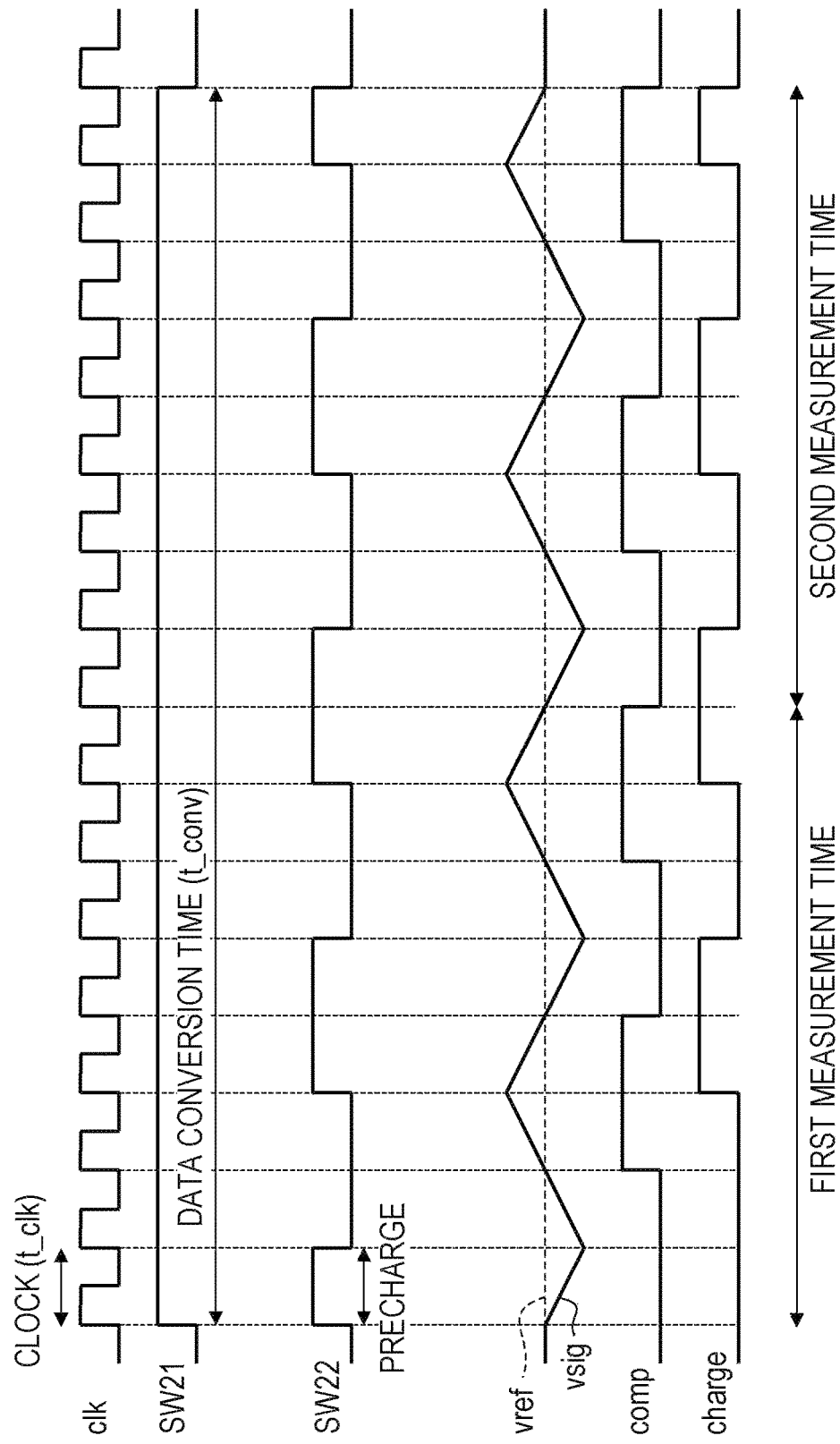
FIG. 7 is a diagram that illustrates examples of action waveforms of the AD conversion circuit.
Figure 8:
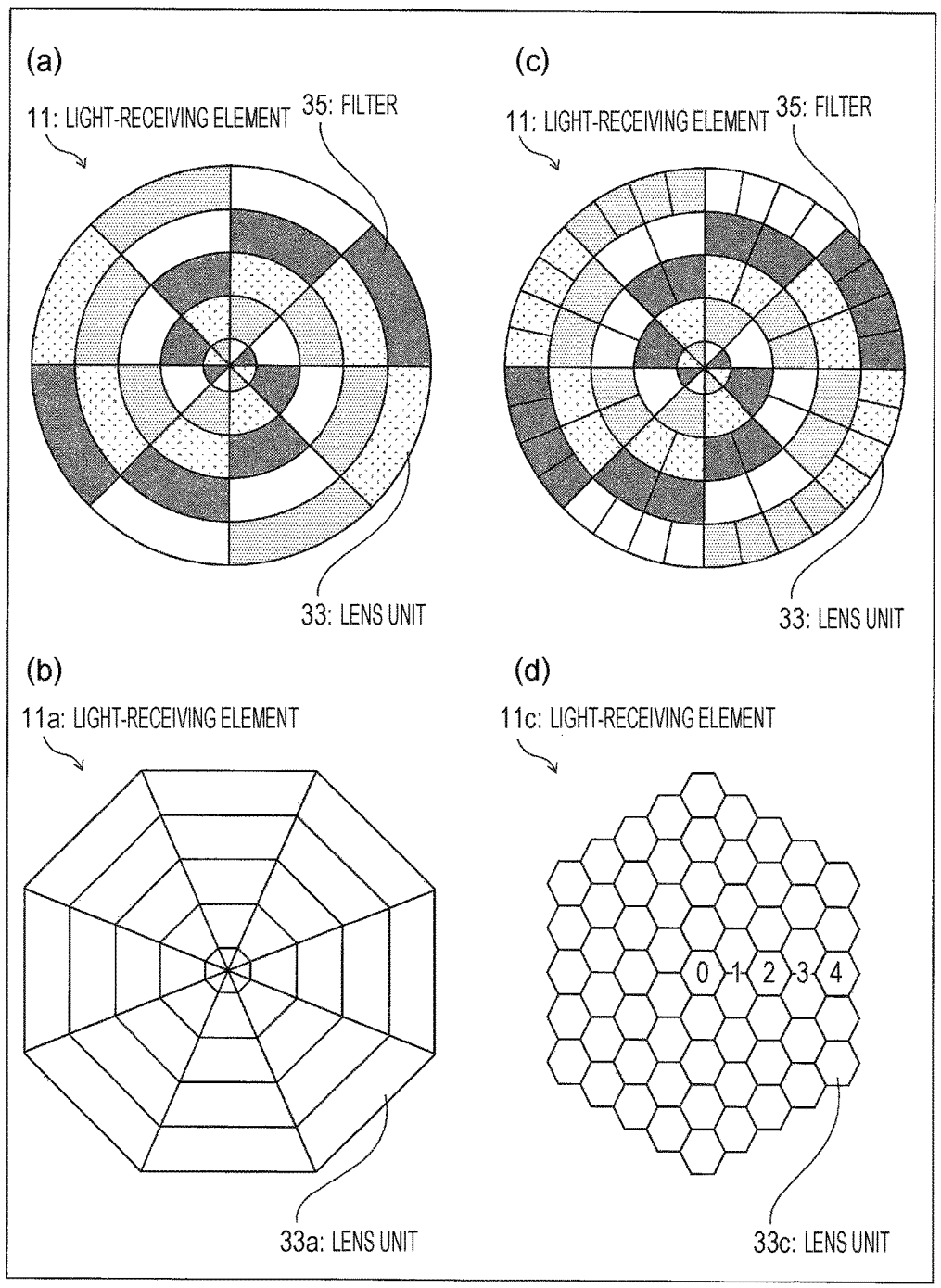
FIG. 8 is a diagram that illustrates examples of configurations of light-receiving units according to a second embodiment of the present invention and examples of configurations of light-receiving units according to a third embodiment of the present invention.

Next, FIG. 7 illustrates examples of action waveforms of the AD conversion circuit ADC. In the drawing, clk represents a clock signal, SW21 represents an open-close state of the switch SW21, SW22 represents an open-close state of the switch SW22, vref represents the voltage of the reference power source V1, vsig represents the output of the charging circuit 21, comp represents the output of the comparator circuit 22, and charge represents the output of the control circuit 23 that is used for opening and closing of the switch SW22.

The switch SW21 is closed before a conversion action starts. Accordingly, an output vsig of the charging circuit 21 (integration circuit) is charged to a voltage vref of the reference power source V1.

The AD conversion circuit ADC1 is enabled to charge to the capacitor C1 with the current Iin by opening of the switch SW21 and performs the conversion action. An opening period of the switch SW21 is a data conversion period (t_conv) and is correspondent to a first measurement time and a second measurement time. In a case where the proximity-illumination sensor 50 acts as the illumination sensor, the illumination is measured by an action in two continuous measurement times (periods). More specifically, detection is performed while the arrangement of the light-receiving elements PD with the spectral characteristic A and the light-receiving elements PD with the spectral characteristic B is switched between the first measurement time and the second measurement time. For example, in a case where the spectral characteristic of a first light-receiving element is the spectral characteristic A and the spectral characteristic of a second light-receiving element is the spectral characteristic B in the first measurement time, the spectral characteristic of the first light-receiving element is changed to the spectral characteristic B and the spectral characteristic of the second light-receiving element is changed to the spectral characteristic A in the second measurement time. Note that here, between the measurement times for measuring the illumination, the initial measurement time is set as the first measurement time, and the next measurement time is set as the second measurement time.

First, the switch SW21 is turned off, and the switch SW22 is turned on. The discharge circuit 24 causes specific charge (I1×t_clk) to be discharged from the capacitor C1 (precharge action). Next, the switch SW22 is switched from on to off, the charging circuit 21 is then charged by the current Iin1 from the light-receiving elements PD, and the output vsig rises. In a case where the output vsig exceeds the voltage vref, an output comp of the comparator circuit 22 is switched from a low level to a high level. Accordingly, an output of the FF 25, that is, the output charge of the control circuit 23 is switched from a low level to a high level, the switch SW22 is turned on, and the specific charge (I1×t_clk) is discharged by the discharge circuit 24.

Next, in a case where the output vsig of the charging circuit 21 drops by the discharge and the output vsig becomes lower than the voltage vref, the output comp of the comparator circuit 22 is switched from the high level to the low level. Accordingly, the output of the FF 25, that is, the output charge of the control circuit 23 is switched from the high level to the low level, the switch SW22 is turned off, and the discharge stops.

Subsequently, the charging circuit 21 is again charged by the current Iin1 from the light-receiving elements PD, and a similar action to the above description is performed.

In the second measurement time after the first measurement time elapses, the charging circuit 21 is charged by a current Iin2 from the other light-receiving elements PD.

Meanwhile, in the data conversion period (t_conv), the counter 26 counts the times in which the output of the FF 25 becomes the high level, that is, the frequency of discharge times, and a digital output of the count value as the value that is correspondent to the input charge amount is performed. Thus, an output of the counter 26 becomes an output ADCOUT1 of the AD conversion circuit ADC1.

The AD conversion circuit ADC1 acts such that the charge amount that is charged by the current Iin (Iin1 or Iin2) becomes equivalent to the charge amount that is discharged by (I1×t_clk). Thus, the following equation holds by "charged charge amount (Iin×t_conv)=discharged charge amount (I1×t_clk×count)".

$$\mathrm{count}=(I_{in}{\times}t\_conv)/(I1{\times}t\_clk)$$

count: count value of discharge times
Iin: input current value
I1: reference current value
t_conv: charging time
t_clk: clock cycle Thus, it may be understood that the minimum resolution of the count value of discharge times (count) is decided by (I1×t_clk).

Here, given that charging period t_convy=t_clk×$2^n$ (n:resolution) is set, $$\mathrm{count}=(I_{in}/I1){\times}2^n$$

holds. Therefore, for example, in a case of the resolution n=16 bits, the count value (count) is output in the range of 0 to 65535 in accordance with the value that is correspondent to the input current Iin. Thus, the AD conversion circuit ADC enables analog-digital conversion with a wide dynamic range and high resolution to be performed. This point is suitable for a device such as the illumination sensor that is at a low speed but is requested to have high resolution (approximately 16 bits).

In such a manner, a measurement signal ADCOUT1 as a digital value in accordance with the photocurrent detected by the spectral characteristic B through the first measurement time and the second measurement time is output from the AD conversion circuit ADC1. Further, similarly, a measurement signal ADCOUT2 as a digital value in accordance with the photocurrent detected by the spectral characteristic A through the first measurement time and the second measurement time is output from the AD conversion circuit ADC2.

The measurement signal ADCOUT1 is multiplied by α (α:constant) by the multiplication unit 13 and is thereafter input to the subtraction unit 14. The measurement signal ADCOUT2 is directly input to the subtraction unit 14. Then, the subtraction unit 14 subtracts the measurement signal ADCOUT1 multiplied by α from the measurement signal ADCOUT2, and a measurement signal (ADCOUT2−ADCOUT1×α) is thereby output. This measurement signal (ADCOUT2−ADCOUT1×α) realizes a spectral characteristic close to the visual sensitivity and becomes a value that represents the illumination of visible light.

The integration type analog-digital conversion circuit illustrated in FIG. 6 is applied to the AD conversion circuits ADC1 and ADC2 illustrated in FIG. 1, and the analog-digital conversion with a wide dynamic range and high resolution, which is included in the integration type analog-digital conversion circuit, is thereby enabled. Because the AD conversion circuits ADC1 and ADC2 are the integration type analog-digital conversion circuits, measurement may be performed by switching the arrangement of the light-receiving elements with the infrared spectral characteristic and the light-receiving elements with the visible-to-infrared spectral characteristic between the first measurement time and the second measurement time, the measurement result of the infrared spectral characteristic may thereby easily be output to ADC1, and the measurement result of the visible-to-infrared spectral characteristic may easily be output to ADC2 also.

Second Embodiment

Next, FIG. 8(a) illustrates one example of a configuration of a light-receiving unit according to a second embodiment of the present invention. This embodiment is different from the configuration of the above-described first embodiment in a point that a filter (color filter) 35 is provided on the side of the light-receiving surface of the above-described light-receiving element 11. The other configurations are similar to the first embodiment, and a description thereof will thus not be made here. In the example illustrated in FIG. 8(a), color filters of red, green, and blue (RGB) are used as the filters 35. Accordingly, it becomes possible to cause the above-described proximity-illumination sensor 50 to act as an RGB illumination sensor.

Modification Example 1

FIG. 8(c) is a diagram that illustrates a modification example of the configuration of the light-receiving unit (light-receiving element 11). In a case where the proximity-illumination sensor 50 acts as the illumination sensor, irradiation with obliquely incident light occurs to regions of peripheral portions 3 and 4, and the spot tends to become much smaller [FIG. 3(a)]. Thus, in the modification example illustrated in FIG. 8(c), the light-receiving area is configured with concentric circular areas, and the number of divisions of outside areas in the concentric circular areas is set more than the number of divisions of inside areas.

In a case where the number of divisions of the light-receiving area (light-receiving element) is small, intense irradiation occurs only to particular light-receiving elements of RGB, and uneven light input occurs, for example. Accordingly, the illumination and color temperature may not be calculated accurately. The number of divisions of the outside areas of the concentric circular areas is made more than the inside areas, the uneven light input of obliquely incident light may thereby be reduced, and the accurate illumination and color temperature may be calculated.

Third Embodiment

Next, FIG. 8(b) illustrates one example of a configuration of a light-receiving unit according to a third embodiment of the present invention. This embodiment is different from the configuration of the above-described first embodiment in a point that the shapes of a light-receiving element 11a and a lens unit 33a are concentric polygonal shape (in this example, concentric octagons). The other configurations are similar to the first embodiment, and a description thereof will thus not be made here. In such a manner, the shape of the light-receiving unit is not limited to the concentric circular shape but may be a concentric polygonal shape. Further, in this case, plural light-receiving elements PD that are included in the light-receiving element 11a are arranged along sides of particular concentric polygons.

Modification Example 2

FIG. 8(d) is a diagram that illustrates a modification example (light-receiving element 11c) of the configuration of the light-receiving unit (light-receiving element). In this embodiment, the shape of the light-receiving element 11c and a lens unit 33c (light-receiving area) is a hexagonal structure in which plural hexagonal areas are aligned in a honeycombed manner. The light-receiving area is formed in the hexagonal structure, the perimeter per unit area may thereby be made short, and the lighting ratio may thus be improved. Further, in this structure, the number of divisions of outside areas becomes large, and a similar effect to the modification example 1 may thus be obtained.

Fourth Embodiment

Figure 9:
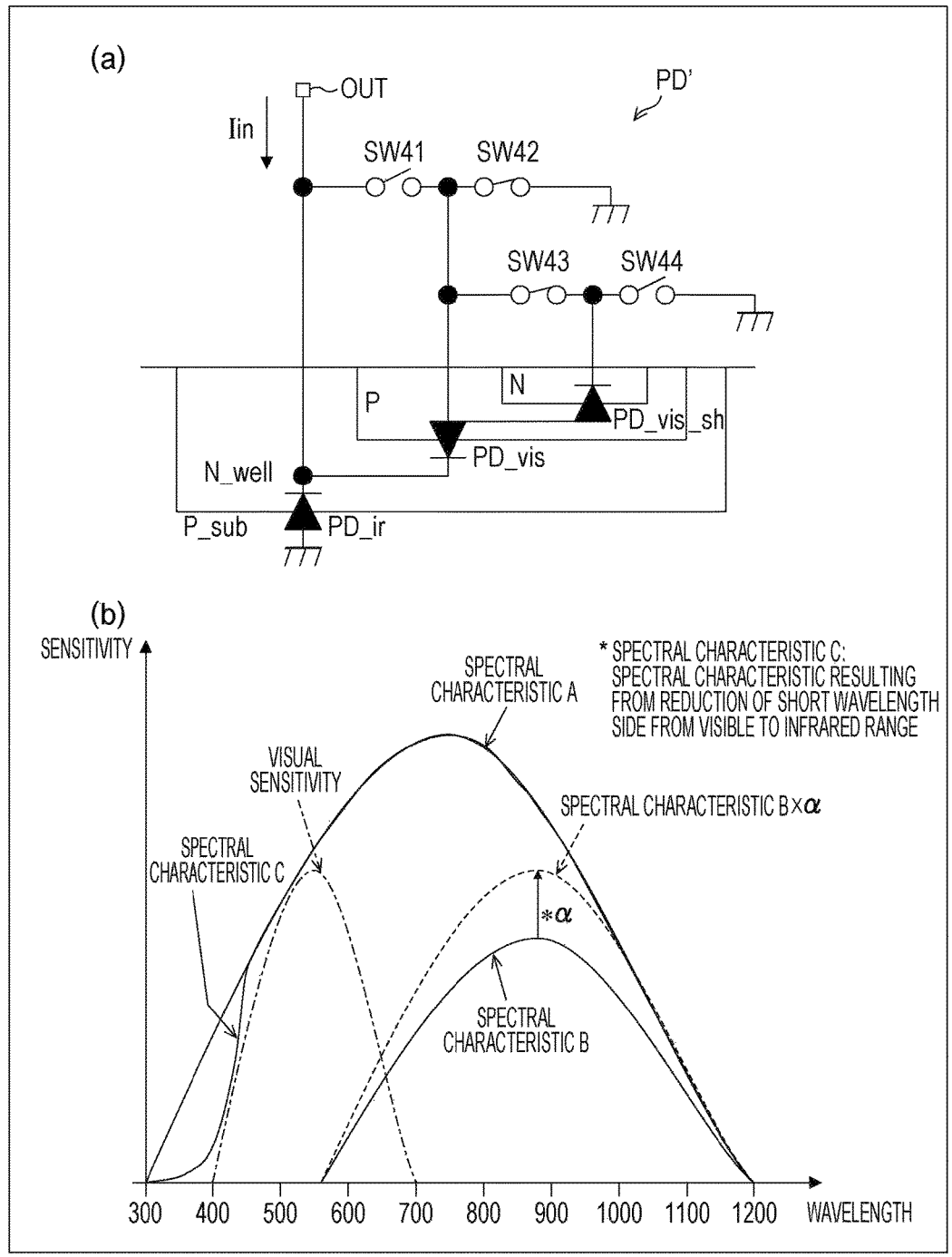
FIG. 9 is a diagram that illustrates one example of a structure and spectral characteristics of a light-receiving element according to a fourth embodiment of the present invention.

Next, FIG. 9 is a diagram that illustrates one example of a structure and spectral characteristics of a light-receiving element PD' according to a fourth embodiment of the present invention. FIG. 9(a) is a circuit diagram that illustrates one example of the structure of the light-receiving element PD' according to the fourth embodiment. Meanwhile, FIG. 9(b) is a graph that represents the spectral characteristics of the light-receiving element PD'. In this embodiment, the light-receiving element PD' that includes three p-n junctions is illustrated as one example. The light-receiving element PD' of this embodiment is different from the first embodiment in a point that the three p-n junctions are included. The other configurations are similar to the first embodiment, and a description thereof will thus not be made here.

As illustrated in FIG. 9(a), the light-receiving element PD' is configured with a semiconductor substrate and switches SW41 to SW44. The semiconductor substrate has a structure in which the n-type well layer (n-type semiconductor region N_well) is formed on the p-type substrate (p-type semiconductor substrate P_sub), the p-type diffusion layer (p-type semiconductor region P) is formed on the n-type well layer, and an n-type diffusion layer (n-type semiconductor region N) is formed on the p-type diffusion layer. The p-type substrate is connected with a ground. The n-type well layer is connected with the output terminal OUT with a higher electric potential than the ground.

In the semiconductor substrate, the photodiode PDir is formed with the p-type substrate and the n-type well layer (p-n junction). Further, the photodiode PDvis is formed with the n-type well layer and the p-type substrate (p-n junction). In addition, a photodiode PDvissh is formed with the p-type diffusion layer and the n-type diffusion layer (p-n junction). Although the photodiode PDir, the photodiode PDvis, and the photodiode PDvissh are formed on the same semiconductor substrate, peak sensitivity wavelengths are different due to the difference in depth among connection portions. That is, the photodiode PDir is formed in a deep position, and the peak sensitivity wavelength is positioned in the wavelength range of infrared rays. Further, the photodiode PDvis is formed in a shallow position, and the peak sensitivity wavelength is positioned in the wavelength range of visible light. In addition, the photodiode PDvissh is formed in a yet shallower position, and the peak sensitivity wavelength is positioned on a short wavelength side of the wavelength range of visible light.

One terminal of the switch SW41 is connected with the output terminal OUT, and the other terminal is connected with the p-type diffusion layer. One terminal of the switch SW42 is connected with the other terminal of the switch SW41 and the p-type diffusion layer, and the other terminal is connected with the ground. One terminal of the switch SW43 is connected with the other terminal of the switch SW41 and the p-type diffusion layer, and the other terminal is connected with the n-type diffusion layer. One terminal of the switch SW44 is connected with the other terminal of the switch SW43 and the n-type diffusion layer, and the other terminal is connected with the ground. Each of the switches SW41 to SW44 opens or closes (on or off) in response to a switch signal and makes electrical connection between both sides continuous or disconnected. Each of the above switch signals is supplied from an external control unit or the like.

Thus, in a case where settings are made as "switch SW41=on, switch SW42=off, switch SW43=on, and switch SW44=off", the photodiode PDir becomes continuous, and the photodiodes PDvis and PDvissh are short-circuited. Thus, only the photodiode PDir is used in the light-receiving element PD'. Therefore, in a case where the light-receiving element PD' receives light in this connection configuration, the photocurrent that flows in the photodiode PDir is output as the current Iin of the light-receiving element PD'. Thus, the light-receiving element PD' in this connection configuration has the spectral characteristic that has sensitivity to the wavelength range of infrared rays (spectral characteristic B).

Further, in a case where settings are made as "switch SW41=off, switch SW42=on, switch SW43=off, and switch SW44=on", the photodiodes PDir and PDvis become continuous, and the photodiode PDvissh is short-circuited. Thus, the photodiodes PDir and PDvis are used in the light-receiving element PD'. Therefore, in a case where the light-receiving element PD' receives light in this connection configuration, the current as the sum of the photocurrent that flows in the photodiode PDir and the photocurrent that flows in the photodiode PDvis is output as the current Iin of the light-receiving element PD'. Thus, the light-receiving element PD' in this connection configuration has the spectral characteristic that has sensitivity to the wavelength range of visible light to infrared rays (spectral characteristic A).

In addition, in a case where settings are made as "switch SW41=off, switch SW42=on, switch SW43=on, and switch SW44=off", the photodiodes PDir, PDvis, and PDvissh become continuous. Thus, the photodiodes PDir, PDvis, and PDvissh are used in the light-receiving element PD'. Therefore, in a case where the light-receiving element PD' receives light in this connection configuration, the current that results from the subtraction of the photocurrent which flows in the photodiode PDvissh from the sum of the photocurrent that flows in the photodiode PDir and the photocurrent that flows in the photodiode PDvis is output as the current Iin of the light-receiving element PD'. Thus, the light-receiving element PD' in this connection configuration has a spectral characteristic that has sensitivity to a wavelength range in which the short wavelength side is reduced from the wavelength range of visible light to infrared rays (hereinafter referred to as spectral characteristic C).

Next, in FIG. 9(b), the horizontal axis represents wavelength (nm), and the vertical axis represents sensitivity. Further, in the graph, the solid lines respectively represents the spectral characteristic A, the spectral characteristic B, and the spectral characteristic C, the broken line represents the spectral characteristic B multiplied by a, and the one-dot chain line represents the visual sensitivity.

The spectral characteristics of the light-receiving element PD' include the spectral characteristic C in addition to the spectral characteristics of the light-receiving element PD. The spectral characteristic C that has sensitivity to the wavelength range in which the short wavelength side is reduced from the wavelength range of visible light to infrared rays has a characteristic that a range of about 300 nm to about 450 nm is reduced from the spectral characteristic A. That is, the spectral characteristic C has substantially equivalent characteristics to the spectral characteristic A in a range of about 450 nm to about 1200 nm.

In such a manner, the light-receiving element PD' includes the three p-n junctions and thereby includes three photodiodes, that is, the photodiodes PDir, PDvis, and PDvissh. Further, the light-receiving element PD' is configured such that the connection configurations are switched by the switches SW41 to SW44 and any of the spectral characteristics A to C may thereby be set.

The structure of the light-receiving element PD' is applied to the light-receiving elements PD included in the light-receiving element 11 of the proximity-illumination sensor 50, and light detection is thereby performed by the spectral characteristic B and the spectral characteristic C, for example. The photocurrent detected by the spectral characteristic B is subtracted from the photocurrent detected by the spectral characteristic C, and a spectral characteristic closer to the visual sensitivity may thereby be obtained. Particularly, the short wavelength side may be made closer to a visual sensitivity characteristic. Further, light detection is performed by the spectral characteristic A and the spectral characteristic C, the photocurrent detected by the spectral characteristic C is subtracted from the photocurrent detected by the spectral characteristic A, and detection of the illumination on the short wavelength side is thereby enabled.

Note that in a case where the light-receiving element PD' is short-circuited, that is, all the photodiodes PDir, PDvis, and PDvissh are short-circuited, settings may be made as "switch SW41=on, switch SW42=on, switch SW43=on, and switch SW44=on".

Fifth Embodiment

Figure 10:
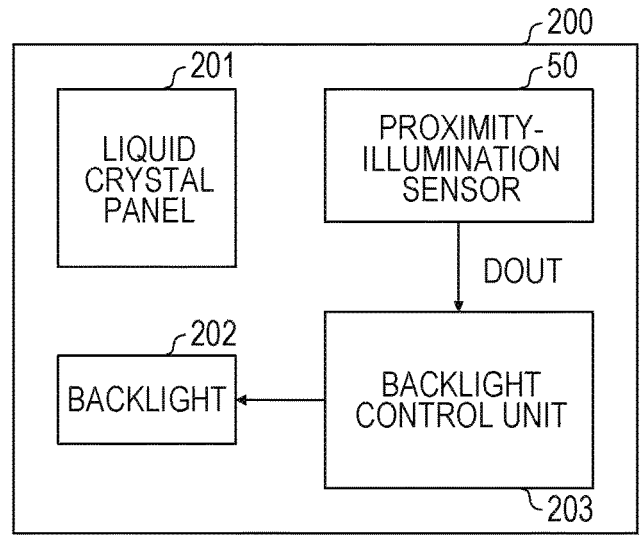
FIG. 10 is a block diagram that illustrates one configuration example of a liquid crystal display device according to a fifth embodiment of the present invention.
Figure 11:
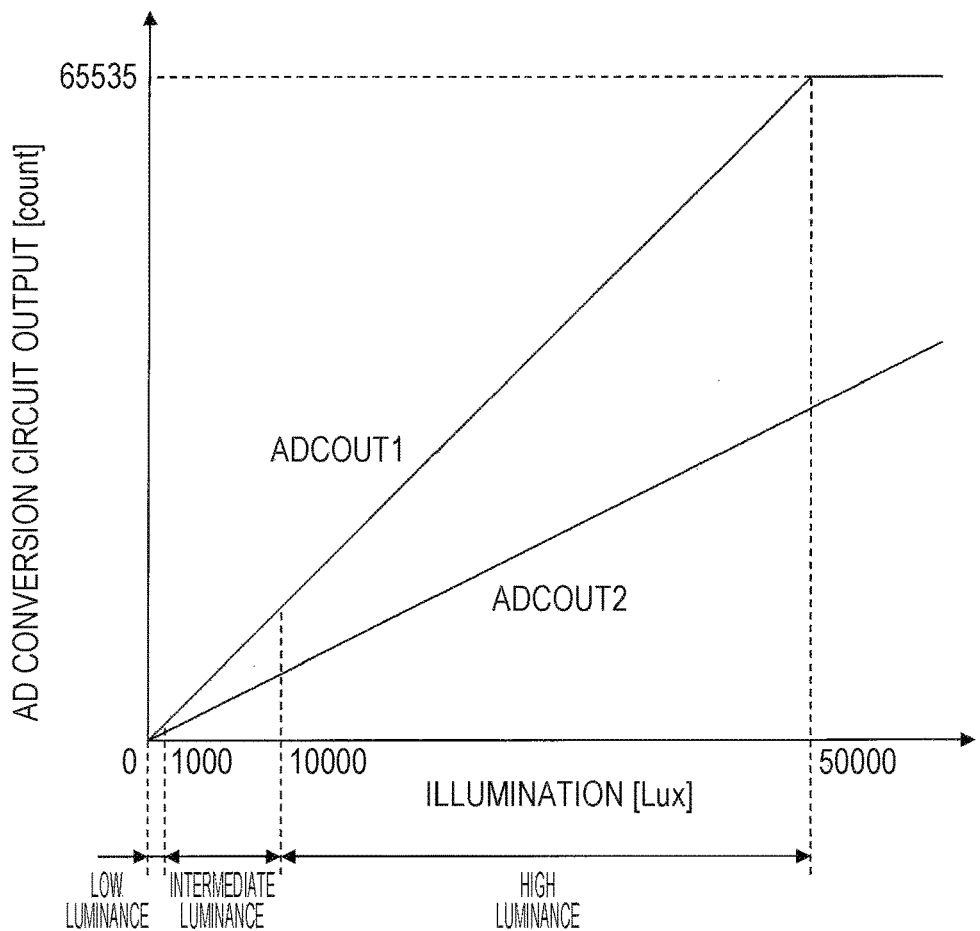
FIG. 11 is related to the liquid crystal display device and is a graph that represents the relationship between an illumination value and an AD conversion circuit output signal.
Figure 12:
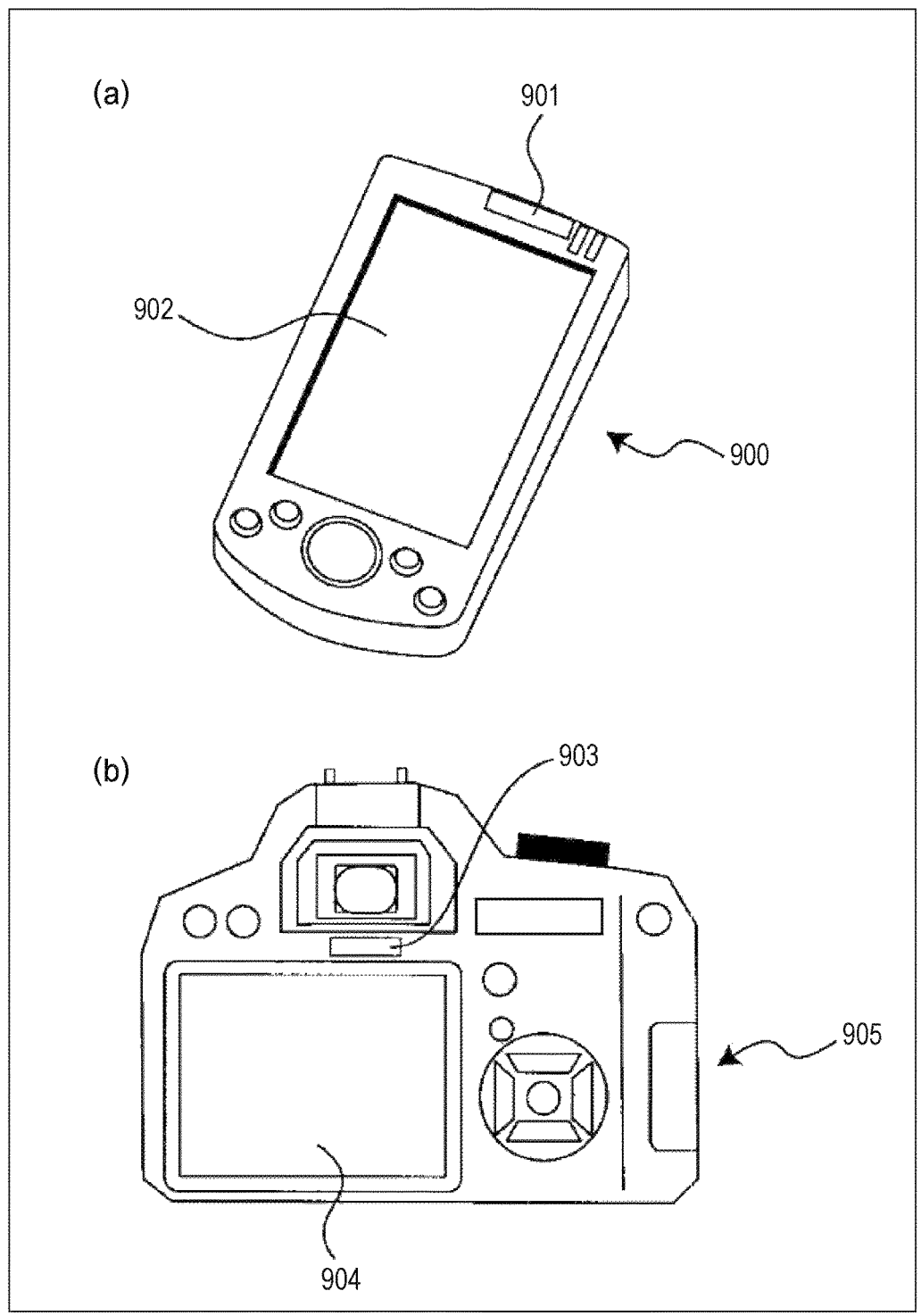
FIG. 12 is a diagram that illustrates an external appearance of a cellular phone according to a sixth embodiment of the present invention and an external appearance of a digital camera according to a seventh embodiment of the present invention.
Figure 13:
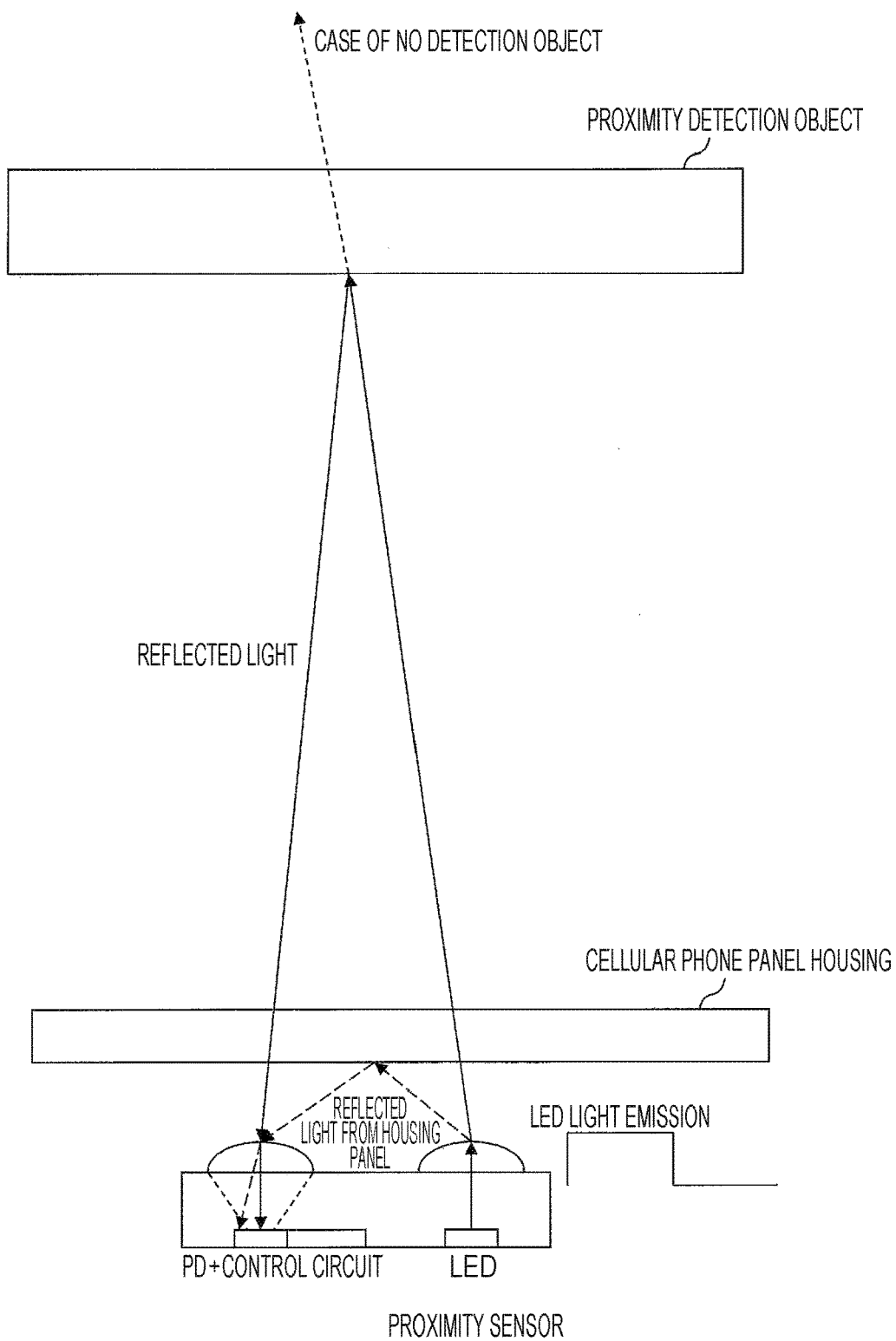
FIG. 13 is a diagram that illustrates an installation example of a proximity sensor in a housing panel.
Figure 14:
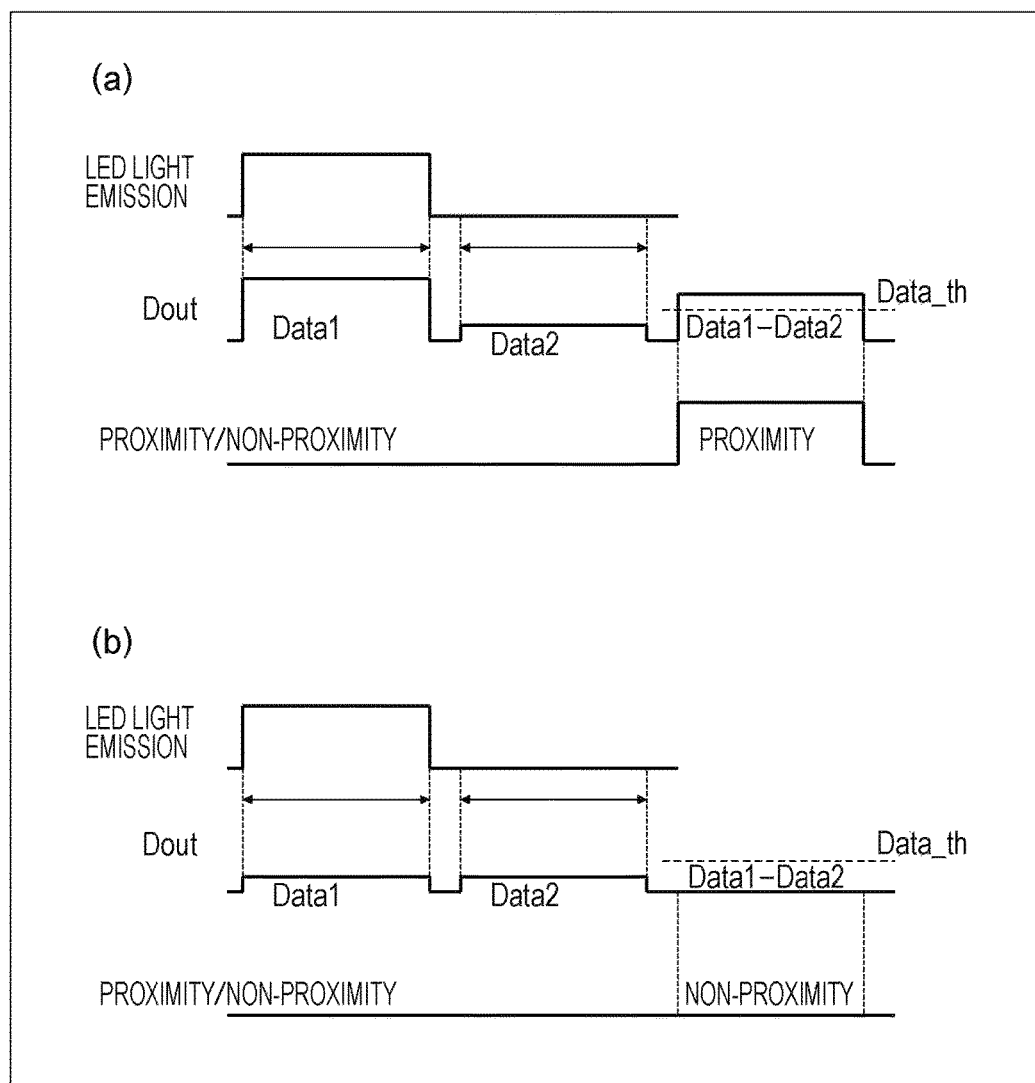
FIG. 14 is a diagram that illustrates action waveforms of the proximity sensor.
Figure 15:
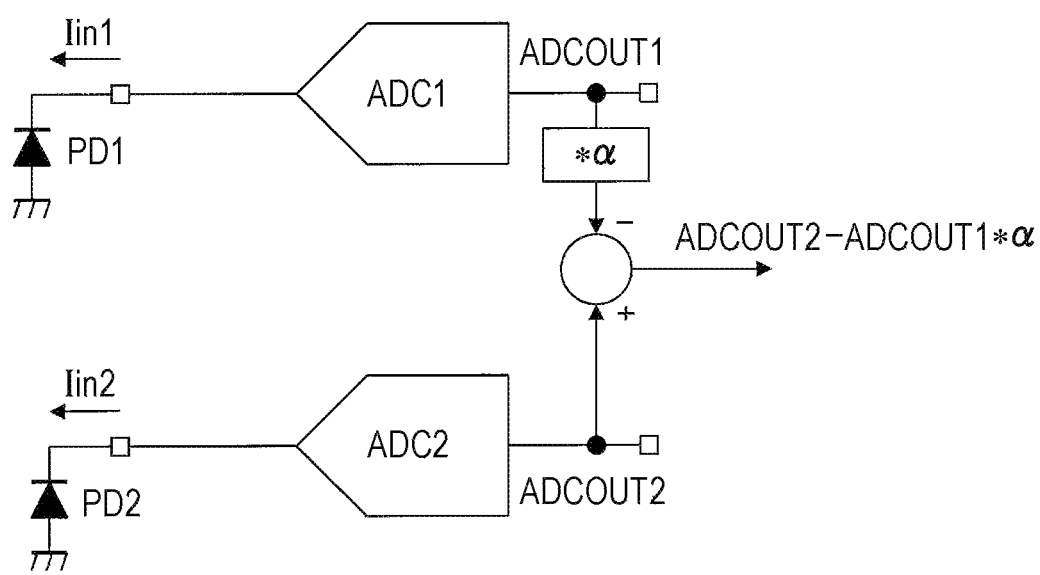
FIG. 15 is a circuit diagram that illustrates an outline configuration of a digital type illumination sensor in related art.

Next, a liquid crystal display device (electronic apparatus) 200 according to a fifth embodiment of the present invention will be described with reference to FIG. 10 and FIG. 11. FIG. 10 is a diagram that illustrates one configuration example of the liquid crystal display device 200 of this embodiment. As illustrated in FIG. 10, the liquid crystal display device 200 includes the above-described proximity-illumination sensor 50, a liquid crystal panel 201 that displays an image, a backlight 202 that performs irradiation for the liquid crystal panel 201, and a backlight control unit 203 that controls the luminance of the backlight 202.

The proximity-illumination sensor 50 outputs a measurement result DOUT to the backlight control unit 203. The measurement result DOUT corresponds to the measurement signal (ADCOUT2−ADCOUT1×α) in a case where the proximity-illumination sensor 50 acts as the illumination sensor and corresponds to the measurement signal ADCOUT2 in a case where the proximity-illumination sensor 50 acts as the proximity sensor. Accordingly, the backlight control unit 203 may control (adjust) the luminance of the backlight 202 in accordance with the ambient brightness or presence or absence of a proximity object.

The liquid crystal display device 200 may be applied to a display device, which includes a liquid crystal panel, of an electronic apparatus such as a cellular phone or a digital still camera, for example. Thus, large effects are provided particularly for a portable electronic apparatus in which reduction in power consumption is requested.

Next, the relationship between an illumination value and an AD conversion circuit output will be described with reference to FIG. 11. In the graph illustrated in FIG. 11, the horizontal axis represents the illumination (lux), and the vertical axis represents the AD conversion circuit output (count). As illustrated in FIG. 11, the AD conversion circuit output linearly fluctuates from 0 to 65535 counts (the full scale of 16 bits) in accordance with the illumination value.

As for the above-described luminance adjustment of the backlight by the backlight control unit 203, for example, change is performed among 0 to 1000 lux as a low luminance region,
1000 to 10000 lux as an intermediate luminance region, and
10000 lux or more as a high luminance region,
and the adjustment is thereby performed such that a screen is viewable even in a case where the ambient light changes.

Sixth Embodiment

Next, a cellular phone (electronic apparatus) 900 according to a sixth embodiment of the present invention will be described with reference to FIG. 12(a). As illustrated in FIG. 12(a), the cellular phone 900 includes the above-described proximity-illumination sensor 50 as a proximity sensor (sensor circuit) 901. The cellular phone 900 includes a liquid crystal monitor 902 and may more quickly perform switching between turning on and off of display of the liquid crystal monitor 902 and switching between lighting and non-lighting of a LED backlight that illuminates the liquid crystal monitor 902 from a back surface side of the liquid crystal monitor 902 in accordance with a proximity state or a non-proximity state of a detected target B than a case where a proximity sensor in related art is included as the proximity sensor 901. Accordingly, responsiveness may be improved compared to a cellular phone that includes the proximity sensor in related art, and use comfortableness for a user may be improved. Note that the cellular phone 900 of this embodiment may include a similar configuration to the liquid crystal display device 200 of the fifth embodiment.

Seventh Embodiment

Next, a digital camera (electronic apparatus) 905 according to a seventh embodiment of the present invention will be described with reference to FIG. 12(b). As illustrated in FIG. 12(b), the digital camera 905 includes the above-described proximity-illumination sensor 50 as a proximity sensor (sensor circuit) 903. The digital camera 905 includes a liquid crystal monitor 904 and may more quickly perform switching between turning on and off of display of the liquid crystal monitor 904 and switching between lighting and non-lighting of a LED backlight that illuminates the liquid crystal monitor 904 from a back surface side of the liquid crystal monitor 904 in accordance with the proximity state or the non-proximity state of the detected target B than a case where the proximity sensor in related art is included as the proximity sensor 903. Accordingly, responsiveness may be improved compared to a digital camera that includes the proximity sensor in related art, and use comfortableness for a user may be improved. Note that the digital camera 905 of this embodiment may include a similar configuration to the liquid crystal display device 200 of the fifth embodiment.

CONCLUSION

A sensor circuit (proximity-illumination sensor 50) according to a first aspect of the present invention is a sensor circuit including a light-receiving unit (light-receiving element 11), in which light-receiving areas of the light-receiving unit are categorized into a first light-receiving area that includes plural light-receiving elements arranged in a vicinity of a center of the light-receiving unit and a second light-receiving area that includes plural light-receiving elements arranged in distant positions from the center of the light-receiving unit, the first light-receiving area and the second light-receiving area being individually set in cases where the sensor circuit acts as a proximity sensor and acts as an illumination sensor, and the sensor circuit includes a light-receiving area selection unit (101) that selects light-receiving sensitivity of which of the first light-receiving area and the second light-receiving area is made higher in accordance with whether the sensor circuit acts as the proximity sensor or acts as the illumination sensor.

In the above configuration, the light-receiving area selection unit selects the light-receiving sensitivity of which of the first light-receiving area and the second light-receiving area is made higher in accordance with whether the sensor circuit acts as the proximity sensor or acts as the illumination sensor. Here, the first light-receiving area is the light-receiving area that is individually set in the cases where the sensor circuit acts as the proximity sensor and acts as the illumination sensor and is the light-receiving area that includes the plural light-receiving elements arranged in the vicinity of the center of the light-receiving unit. Meanwhile, the second light-receiving area is the light-receiving area that is individually set in the cases where the sensor circuit acts as the proximity sensor and acts as the illumination sensor and is the light-receiving area that includes the plural light-receiving elements arranged in the distant positions from the center of the light-receiving unit.

Further, in a case where the light-receiving sensitivity of the second light-receiving area is made higher than the light-receiving sensitivity of the first light-receiving area, the directional characteristic of the light that is incident on the light-receiving unit may be made wide. Meanwhile, in a case where the light-receiving sensitivity of the first light-receiving area is made higher than the light-receiving sensitivity of the second light-receiving area, the directional characteristic of the light that is incident on the light-receiving unit may be made narrow. As a result, the directional characteristic of the light that is incident on the light-receiving unit may be adjusted in accordance with whether the sensor circuit is caused to act as the proximity sensor or to act as the illumination sensor.

As for the sensor circuit according to a second aspect of the present invention, in the first aspect, in a case where the sensor circuit acts as the illumination sensor, the light-receiving area selection unit preferably short-circuits the light-receiving elements included in the first light-receiving area to make the light-receiving sensitivity of the second light-receiving area higher than the light-receiving sensitivity of the first light-receiving area. In the above configuration, the light-receiving sensitivity of the second light-receiving area is made higher than the light-receiving sensitivity of the first light-receiving area, and it thereby becomes possible to obtain the wide directional characteristic. In a case where the sensor circuit is mounted on an electronic apparatus such as a cellular phone, a stable illumination result may be obtained even in a case where the incident angle of light fluctuates due to hand movement or the like.

As for the sensor circuit according to a third aspect of the present invention, in the first or second aspect, in a case where the sensor circuit acts as the proximity sensor, the light-receiving area selection unit preferably short-circuits the light-receiving elements included in the second light-receiving area to make the light-receiving sensitivity of the first light-receiving area higher than the light-receiving sensitivity of the second light-receiving area. In the above configuration, the light-receiving sensitivity of the first light-receiving area is made higher than the light-receiving sensitivity of the second light-receiving area, and it thereby becomes possible to obtain the narrow directional characteristic. In a case where the sensor circuit is mounted on an electronic apparatus such as a cellular phone, the noise light amount due to the housing panel reflection of the electronic apparatus may be reduced.

As for the sensor circuit according to a fourth aspect of the present invention, in any one of the first to third aspects, each of the light-receiving elements included in the first light-receiving area and each of the light-receiving elements included in the second light-receiving area may include plural p-n junctions whose spectral characteristics are different from each other. In the above configuration, it is possible to select a desired spectral characteristic in accordance with whether the sensor circuit is caused to act as the proximity sensor or to act as the illumination sensor.

As for the sensor circuit according to a fifth aspect of the present invention, in the fourth aspect, the sensor circuit preferably includes a spectral characteristic selection unit (102) that causes a portion of the light-receiving elements of the light-receiving elements included in the first light-receiving area and the light-receiving elements included in the second light-receiving area to have a spectral characteristic for an infrared region and that causes remaining light-receiving elements to have a spectral characteristic for the infrared region to a visible light region. In the above configuration, in a case where the sensor circuit acts as the illumination sensor, the output of the spectral characteristic for the infrared region is subtracted from the output of the spectral characteristic for the infrared region to the visible light region, and the illumination characteristic that matches the visual sensitivity may thereby be realized. Meanwhile, in a case where the sensor circuit acts as the proximity sensor, the output of the spectral characteristic for the infrared region is used, and it thereby becomes possible to reduce visible light and to reduce noise such as a fluorescent lamp.

As for the sensor circuit according to a sixth aspect of the present invention, in any one of the first to fifth aspects, the sensor circuit may include a color filter (filter 35) on a light-receiving surface side of the light-receiving unit. In the above configuration, for example, the sensor circuit includes color filters of red, green, and blue (RGB), and it thereby becomes possible to cause the sensor circuit to act as the RGB illumination sensor.

An electronic apparatus according to a seventh aspect of the present invention may be an electronic apparatus (liquid crystal display device 200) that includes the sensor circuit of any of the first to sixth aspects, the electronic apparatus may include: a backlight (202) that performs light irradiation for a liquid crystal panel (201) which is included in the electronic apparatus; and a backlight control unit (203) that controls luminance of the backlight, and the backlight control unit may control the luminance of the backlight based on an output signal of an analog-digital conversion circuit that is included in the sensor circuit. In the above configuration, the sensor circuit may be applied to backlight luminance control of a liquid crystal panel included in the electronic apparatus such as a cellular phone or a digital still camera, for example.

As for the sensor circuit according to an eighth aspect of the present invention, in any one of the first to sixth aspects, the sensor circuit preferably includes a lens structure on a side of a light-receiving surface of the light-receiving unit.

The above lens structure enables signal light from the direct front to be concentrated and enables the spot of the housing reflection to be displaced to the outside where sensitivity is not present in a case where the sensor circuit acts as the proximity sensor. In a case where the sensor circuit acts as the illumination sensor, the directional characteristic may be flattened.

As for the sensor circuit according to a ninth aspect of the present invention, in the fourth aspect, in the light-receiving area, an area that acts as the illumination sensor and an area that acts as the proximity sensor may partially overlap with each other.

In the light-receiving area, the area that acts as the illumination sensor and the area that acts as the proximity sensor are caused to partially overlap with each other and are switched in accordance with use. Accordingly, the wider directional characteristic may be obtained in the case of the illumination sensor, and the optimal light-receiving area that matches the spot may be selected in the case of the proximity sensor.

As for the sensor circuit according to a tenth aspect of the present invention, in any one of first to sixth, eighth, and ninth aspects, the light-receiving area may be configured with concentric circular areas, and the number of divisions of outside areas in the concentric circular areas may be set more than the number of divisions of inside areas.

The number of divisions of the outside areas of the concentric circular areas is made more than the inside areas, the uneven light input of obliquely incident light may thereby be reduced, and the accurate illumination and color temperature may be calculated.

As for the sensor circuit according to an eleventh aspect of the present invention, in any one of the first to sixth, eighth, and ninth aspects, the light-receiving area may be configured with a hexagonal structure in which plural hexagonal areas are aligned in a honeycombed manner.

The light-receiving area is formed in the hexagonal structure, the perimeter per unit area may thereby be made short, and the lighting ratio may thus be improved. Further, in this structure, the number of divisions of outside areas becomes large, and a similar effect to the tenth aspect may thus be obtained.

[Different Expressions of the Present Invention]

The present invention may also be expressed as follows.

That is, a sensor circuit according to one aspect of the present invention may be capable of acting as a proximity sensor and an illumination sensor and may include a lens shape on an upper surface of a light-receiving unit that includes plural light-receiving elements, the plural light-receiving elements may be arranged on concentric circles, the light-receiving unit may have a concentric circular sensitivity distribution, and the light-receiving area whose light-receiving sensitivity is made higher may be selectable from plural light-receiving areas included in the light-receiving unit respectively in a proximity sensor action and in an illumination sensor action.

Further, in the sensor circuit according to another aspect of the present invention, the sensitivity distribution in the illumination sensor action preferably becomes higher toward the outside of the light-receiving unit.

Further, in the sensor circuit according to still another aspect of the present invention, the sensitivity distribution in the proximity sensor action preferably becomes higher toward the inside of the light-receiving unit.

Further, in the sensor circuit according to yet another aspect of the present invention, each of the plural light-receiving elements included in the light-receiving unit may be a light-receiving element that includes two or more p-n junctions such that spectral characteristics are selectable.

Further, in the sensor circuit according to yet another aspect of the present invention, a portion of the light-receiving elements of the plural light-receiving elements included in the light-receiving unit preferably has an infrared spectral characteristic, and the remaining light-receiving elements preferably has a visible-to-infrared spectral characteristic.

Further, the sensor circuit according to yet another aspect of the present invention may include an optical filter.

Further, a cellular phone or a digital camera according to one aspect of the present invention may include a liquid crystal panel that displays a screen, a backlight that performs irradiation for the liquid crystal panel, and a backlight control unit that controls luminance of the backlight, and the sensor circuit and may control the luminance of the backlight based on an output signal of an analog-digital conversion circuit of the sensor circuit.

[Special Notes]

The present invention is not limited to the above-described embodiments. Various modifications are possible in the scope described in claims, and embodiments that are obtained by appropriately combining technical means disclosed in the different embodiments are included in the technical scope of the present invention. In addition, new technical features may be formed by combining technical means that are disclosed in the embodiments.

INDUSTRIAL APPLICABILITY

The present invention may be used for a sensor circuit that includes a light-receiving unit for receiving light and an electronic apparatus that includes the sensor circuit.

REFERENCE SIGNS LIST 0 to 4 PD (light-receiving element)
11 light-receiving element (light-receiving unit)
11a light-receiving element (light-receiving unit)
35 filter (color filter)
50 proximity-illumination sensor (sensor circuit)
101 light-receiving area selection unit
102 spectral characteristic selection unit
200 liquid crystal display device (electronic apparatus)
201 liquid crystal panel
202 backlight
203 backlight control unit
900 cellular phone (electronic apparatus)
901 proximity sensor (sensor circuit)
903 proximity sensor (sensor circuit)
905 digital camera (electronic apparatus)
ADC1 analog-digital conversion circuit
ADC2 analog-digital conversion circuit

The invention claimed is:

1. A sensor circuit comprising:
a light-receiving unit, wherein
light-receiving areas of the light-receiving unit are categorized into a first light-receiving area that includes plural light-receiving elements arranged in a vicinity of a center of the light-receiving unit and a second light-receiving area that includes plural light-receiving elements arranged in distant positions from the center of the light-receiving unit, the first light-receiving area and the second light-receiving area being individually set in cases where the sensor circuit acts as a proximity sensor and acts as an illumination sensor,
the sensor circuit includes a light-receiving area selection unit that selects light-receiving sensitivity of which of the first light-receiving area and the second light-receiving area is made higher in accordance with whether the sensor circuit acts as the proximity sensor or acts as the illumination sensor, and
in a case where the sensor circuit acts as the illumination sensor, the light-receiving area selection unit short-circuits the light-receiving elements included in the first light-receiving area to make the light-receiving sensitivity of the second light-receiving area higher than the light-receiving sensitivity of the first light-receiving area.

2. The sensor circuit according to claim 1, wherein each of the light-receiving elements included in the first light-receiving area and each of the light-receiving elements included in the second light-receiving area include plural p-n junctions whose spectral characteristics are different from each other.

3. The sensor circuit according to claim 2, wherein in the light-receiving area, an area that acts as the illumination sensor and an area that acts as the proximity sensor partially overlap with each other.

4. The sensor circuit according to claim 1, comprising:
a color filter on a light-receiving surface side of the light-receiving unit.

5. The sensor circuit according to claim 1, comprising:
a lens structure on a side of a light-receiving surface of the light-receiving unit.

6. The sensor circuit according to claim 1, wherein
the light-receiving area is configured with concentric circular areas, and
the number of divisions of outside areas in the concentric circular areas is set more than the number of divisions of inside areas.

7. The sensor circuit according to claim 1, wherein the light-receiving area is configured with a hexagonal structure in which plural hexagonal areas are aligned in a honeycombed manner.

8. A sensor circuit comprising:
a light-receiving unit, wherein
light-receiving areas of the light-receiving unit are categorized into a first light-receiving area that includes plural light-receiving elements arranged in a vicinity of a center of the light-receiving unit and a second light-receiving area that includes plural light-receiving elements arranged in distant positions from the center of the light-receiving unit, the first light-receiving area and the second light-receiving area being individually set in cases where the sensor circuit acts as a proximity sensor and acts as an illumination sensor,
the sensor circuit includes a light-receiving rea selection unit that selects light-receiving sensitivity of which of the first light-receiving area and the second light-receiving area is made higher in accordance with whether the sensor circuit acts as the proximity sensor or acts as the illumination sensor, and
in a case where the sensor circuit acts as the proximity sensor, the light-receiving area selection unit short-circuits the light-receiving elements included in the second light-receiving area to make the light-receiving sensitivity of the first light-receiving area higher than the light-receiving sensitivity of the second light-receiving area.

9. The sensor circuit according to claim 3, wherein each of the light-receiving elements included in the first light-receiving area and each of the light-receiving elements included in the second light-receiving area include plural p-n junctions whose spectral characteristics are different from each other.

10. The sensor circuit according to claim 3, comprising:
a color filter on a light-receiving surface side of the light-receiving unit.

11. The sensor circuit according to claim 3, comprising:
a lens structure on a side of a light-receiving surface of the light-receiving unit.

12. The sensor circuit according to claim 3, wherein
the light-receiving area is configured with concentric circular areas, and
the number of divisions of outside areas in the concentric circular areas is set more than the number of divisions of inside areas.

13. The sensor circuit according to claim 3, wherein the light-receiving area is configured with a hexagonal structure in which plural hexagonal areas are aligned in a honeycombed manner.

* * * * *